US 8,447,572 B2

(12) United States Patent
Ishikawa

(10) Patent No.: US 8,447,572 B2
(45) Date of Patent: May 21, 2013

(54) ASSEMBLING MANIPULABILITY EVALUATION APPARATUS, METHOD, AND PROGRAM

(75) Inventor: Shigeo Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1249 days.

(21) Appl. No.: 11/905,963

(22) Filed: Oct. 5, 2007

(65) Prior Publication Data

US 2008/0162097 A1    Jul. 3, 2008

(30) Foreign Application Priority Data

Dec. 28, 2006  (JP) ................................ 2006-354315

(51) Int. Cl.
G06F 17/50    (2006.01)
(52) U.S. Cl.
USPC ................................................ 703/1; 700/96
(58) Field of Classification Search
USPC ..................... 703/1; 715/701; 702/42, 33, 34
See application file for complete search history.

(56) References Cited

U.S. PATENT DOCUMENTS

| | | | | | |
|---|---|---|---|---|---|
| 5,107,444 | A | * | 4/1992 | Wu | 345/419 |
| 5,548,694 | A | * | 8/1996 | Frisken Gibson | 345/424 |
| 5,631,861 | A | * | 5/1997 | Kramer | 703/7 |
| 6,195,625 | B1 | * | 2/2001 | Day et al. | 703/7 |
| 6,219,049 | B1 | * | 4/2001 | Zuffante et al. | 715/764 |
| 7,084,884 | B1 | * | 8/2006 | Nelson et al. | 345/619 |
| 7,262,766 | B2 | * | 8/2007 | Minami et al. | 345/419 |
| 7,315,798 | B2 | * | 1/2008 | Goto et al. | 703/2 |
| 2002/0161562 | A1 | * | 10/2002 | Strunk et al. | 703/6 |
| 2005/0071091 | A1 | * | 3/2005 | Dong et al. | 702/42 |

FOREIGN PATENT DOCUMENTS

| | | |
|---|---|---|
| JP | 2000-29922 | 1/2000 |
| JP | 2002-73701 | 3/2002 |
| JP | 2003-122805 | 4/2003 |
| JP | 2004-178222 | 6/2004 |

OTHER PUBLICATIONS

Sugimoto Kensho, "Machine Translation of Japanese Publication No. 2004-178222", Nov. 2002, <www19.ipdl.inpit.go.jp>, pp. 1-26.*
Zhuang et al., "Haptic Interaction with Global Deformations", 2000, Proceedings of the 2000 IEEE International Conference on Robotics and Automation, pp. 2428-2433.*
Fang et al, "Virtual Prototyping of Mechanical Assemblies with Deformable Components", Journal of Manufacturing Systems, vol. 16, No. 3, 1997.*

(Continued)

Primary Examiner — Mary C Jacob
(74) Attorney, Agent, or Firm — Staas & Halsey LLP

(57) ABSTRACT

An analysis model control unit disposes at least two component models, which are to be used in assembly of a product to be evaluated, in virtual space displayed on a screen. A virtual glove controller moves and operates component models, which are disposed in virtual space, in accordance with an input operation signal of a user by a virtual glove. When the two component models are brought into contact with each other, a model conversion unit converts them into component analysis models. A deformed structure analysis unit executes structure analysis calculations with respect to the relative movement caused along with assembly of the two component analysis models after contact so as to calculate deformation and deformation stresses. An evaluation processing unit compares the deformation stress with a threshold stress of the material so as to evaluate whether assembly can be performed without breaking the components.

13 Claims, 15 Drawing Sheets

OTHER PUBLICATIONS

Duriez et al, "Interactive Haptics for Virtual Prototyping of Deformable Objects: Snap-in Tasks Case", feedback 20 (2003), 28.*

Duriez et al, "Realistic Haptic Rendering of Interacting Deformable Objects in Virtual Environments", IEEE Transactions on Visualization and Computer Graphics, vol. 12, No. 1, Jan./Feb. 2006.*

Chen et al, "On the Development of a Haptic System for Rapid Product Development", Computer-Aided Design, 37, pp. 559-569, 2005.*

Japanese Office Action issued Jul. 19, 2011 in corresponding Japanese Patent Application 2006-354315.

* cited by examiner

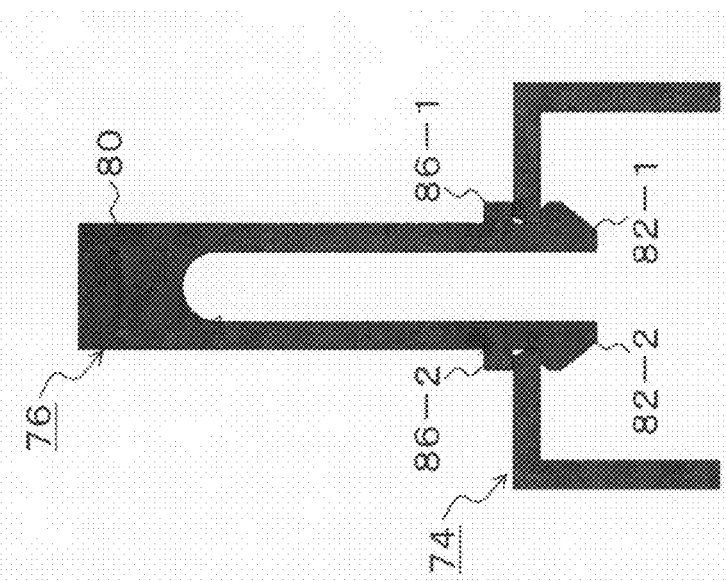
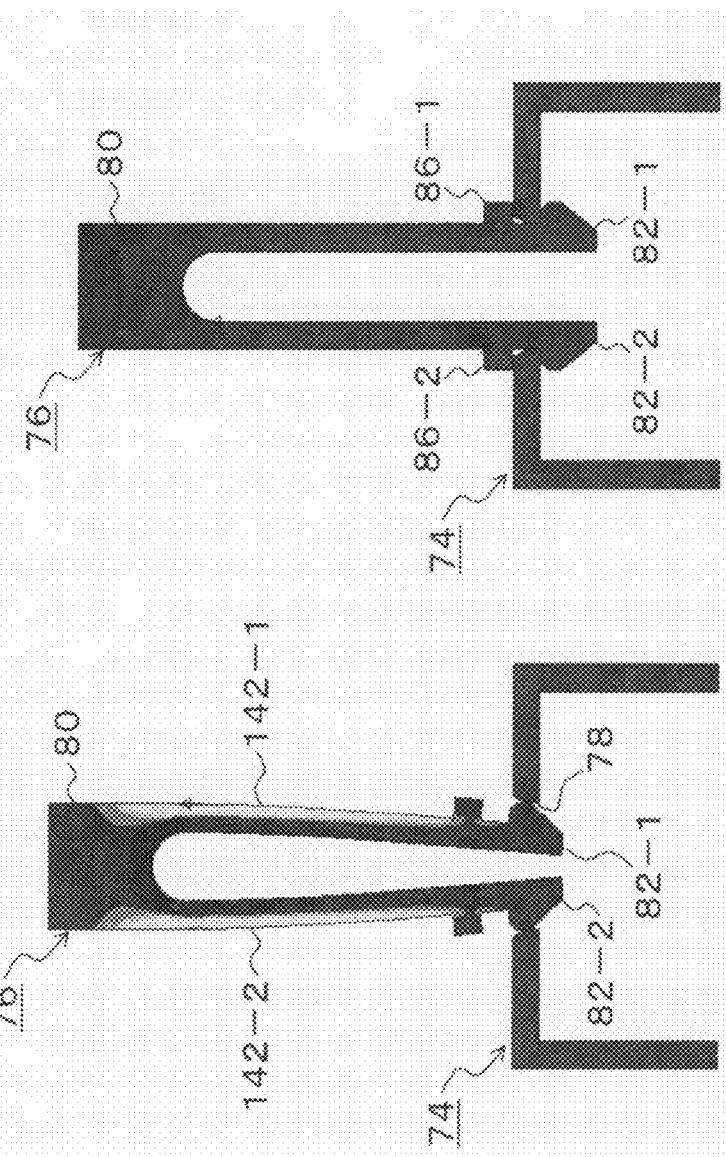
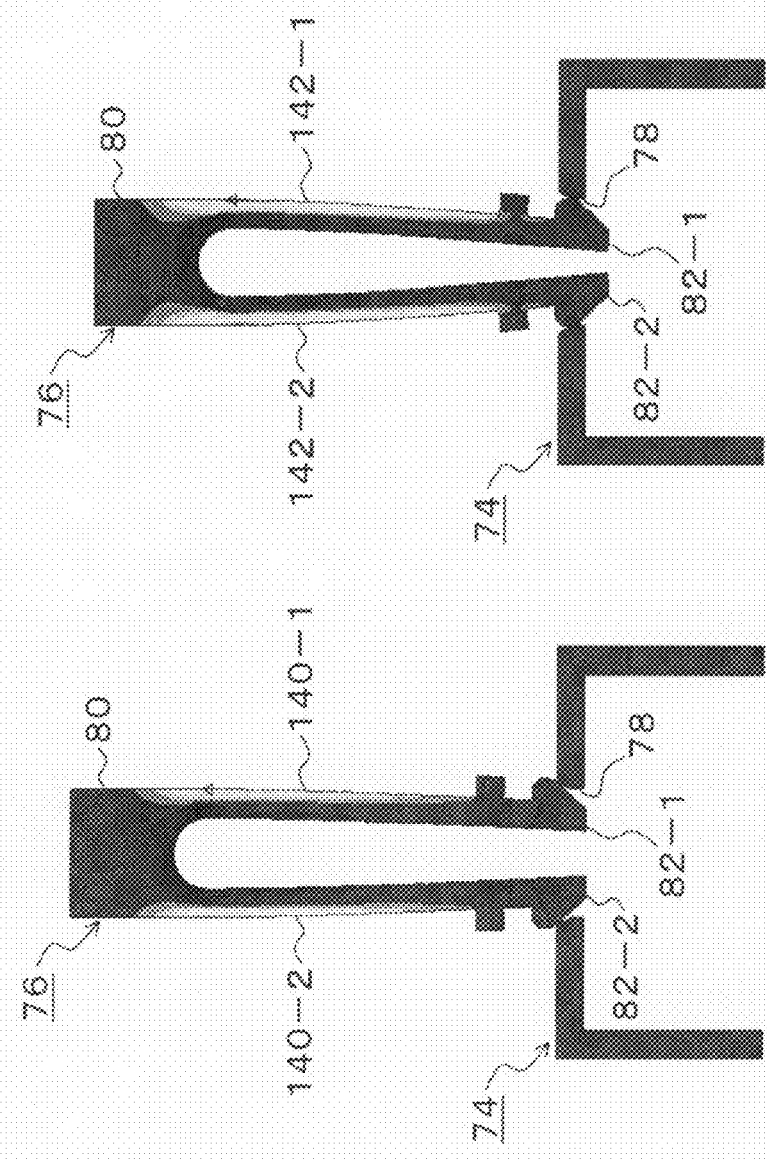

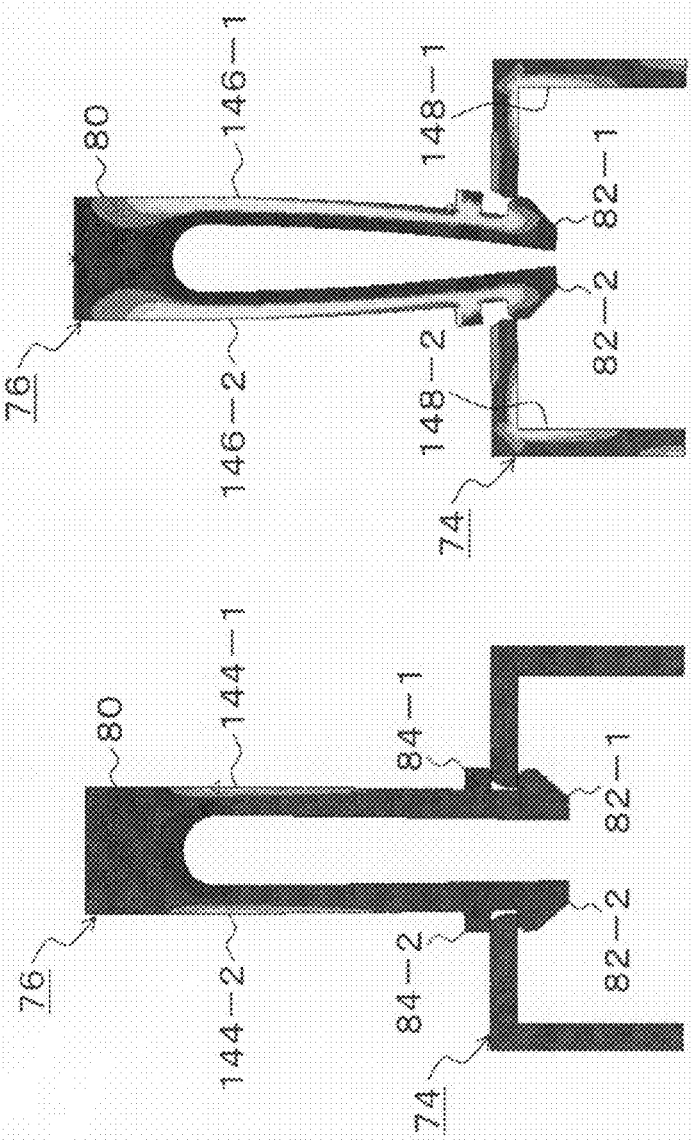

ASSEMBLING MANIPULABILITY EVALUATION APPARATUS, METHOD, AND PROGRAM

This application is based upon and claims the benefit of priority from prior Japanese Patent application No. JP 2006-354315, filed Dec. 28, 2006, in Japan, the entire contents of which are incorporated herein by reference.

BACKGROUND OF THE INVENTION

1. Field of the Invention

The present invention relates to an assembling manipulability evaluation apparatus, method, and program which evaluate appropriateness of an assembly operation by performing component assembly in virtual space corresponding to the movement of a hand of an operator and, in particular, relates to an assembling manipulability evaluation apparatus, method, and program which evaluate assembling manipulability while analyzing deformation stresses of the components which are deformed and engaged upon assembly.

2. Description of the Related Arts

Conventionally, assembling manipulability evaluation apparatuses which convert components into models in virtual space built by a computer, display them therein, and define an assembling procedure so as to evaluate whether assembling or operations of the components can be performed without a problem are known (JP2004-178222 and JP2002-073701). The assembly performance evaluation apparatus of JP2004-178222 three-dimensionally displays images of components of an assembly evaluation objective product, tools, hands of a user, etc. in virtual space by three-dimensional CAD and causes the user to experience assembly of the components corresponding to movement of the hands of the user as virtual reality, thereby performing examination of assembling manipulability. As a simulation of product assembly performed in virtual space of a computer, the assembly apparatus of JP2002-073701 forms a component having flexibility such as a wire harness or a rubber tube, in which deformation due to external force is caused, by a simple model which is a linear member composed of alternately connected minute bodies and elastic bodies, thereby assembling a product including flexible part components.

However, in such conventional assembling manipulability evaluation apparatuses, basically, components have been converted into models as rigid bodies and moved and rotated according to orders such as movement of the hands of a user so as to examine, merely, whether interference between the components occur or not during assembly or operation; therefore, in assembly of a product which undergoes an assembling operation while rigid component models are deformed to some extent, for example, like assembly of components by claw engagement, there is a problem that satisfactory examination cannot be performed. More specifically, in the conventional assembly evaluation apparatuses, for example regarding claw engagement of rigid component models, the models can be deformed to open claws so that interference between components do not occur with respect to push-in of engagement protrusions; however, since what kind of stresses are generated with respect to the deformation is unknown, there is a problem that whether the assembly by the claw engagement is appropriate or not cannot be evaluated.

SUMMARY OF THE INVENTION

According to the present invention to provide an assembling manipulability evaluation apparatus, method, and program which can handle an assembling operation during deformation of components and, at the same time, can evaluate whether assembly can be performed or not without breaking the components by combining evaluation of virtual assembling manipulability with a structure analysis simulation.

It is another object of the present invention to provide the assembling manipulability evaluation apparatus, method, and program which can further handle a disassembling operation of a product in which a component is removed while being deformed and, at the same time, can evaluate whether the disassembly can be performed or not without breaking the components.

(Apparatus)

The present invention provides an assembling manipulability evaluation apparatus. The assembling manipulability evaluation apparatus of the present invention is characterized by having an analysis model control unit which disposes at least two component models, which are to be used in assembly of a product to be evaluated, in virtual space displayed in screen;

a virtual operation control unit which moves and operates the component model disposed in the virtual space in accordance with an input operation signal from outside;

a model conversion unit which converts the two component models into component analysis models when the two component models are brought into contact with each other;

a deformed structure analysis unit which executes a structure analysis calculation with respect to relative movement caused along with assembly of the two component analysis models after the contact and deforms the models; and an evaluation processing unit which evaluates assembling manipulability based on the result of the structure analysis calculation of the component analysis model.

Herein, the virtual assembly operation unit has a detection unit which detects movement of a hand of an operator and outputs a detection signal;

a virtual assembly unit which disposes a virtual glove in the virtual space and moves the virtual glove in accordance with the detection signal so as to perform an assembling operation; and a reaction force feedback unit which calculates reaction force from a deformation stress of the component analysis model calculated by the structure analysis unit and transmits the force to the hand of the operator.

The model conversion unit determines contact between the two component models when the relative distance between the models becomes zero and converts the two component models into component analysis models composed of a plurality of mesh-divided elements;

the structure analysis unit determines contact surfaces of the two component analysis models, executes a structure analysis calculation so that, with respect to movement of the contact surface of one of the component analysis models, the contact surface of the other structure analysis model does not penetrate into each other, and obtains deformation, distortion, and stress of each element and deformation of entire models; and the evaluation processing unit searches a maximum deformation stress from among deformation stresses of the mesh constituting the deformed component analysis model, compares the stress with a rupture stress of the component which is set in advance, and performs alert display of rupture of the component when the stress is determined to exceed the rupture stress.

The evaluation processing unit further has a stress color conversion unit which converts deformation stress of the mesh constituting the deformed component analysis model into color information; and a stress distribution display unit which displays stress distribution with respect to an arbitrary cross section of the component analysis model according to the color information.

The assembling manipulability evaluation apparatus of the present invention further has a disassembling manipulability evaluation processing unit which disassembles a component model from a product model, of which assembly is completed, and evaluates disassembling manipulability.

The disassembling manipulability evaluation processing unit has an analysis model control unit which disposes a product model including at least two component models to be evaluated in virtual space displayed in a screen;

a virtual operation control unit which moves and operates to disassemble the component model from the product model disposed in the virtual space in accordance with an input operation signal from outside;

a model conversion unit which converts the two component models into component analysis models;

a deformed structure analysis unit which executes a structure analysis calculation with respect to relative movement caused along with disassembly of the two component analysis models and deforms the models; and a disassembling manipulability evaluation processing unit which evaluates disassembling manipulability based on the result of the structure analysis calculation of the component analysis model.

The virtual operation control unit has a detection unit which detects movement of a hand of an operator and outputs a detection signal;

a virtual disassembly unit which disposes a virtual glove in the virtual space and moves the virtual glove in accordance with the detection signal so as to perform a disassembling operation; and a reaction force feedback unit which calculates reaction force from a deformation stress of the component analysis model calculated by the deformed structure analysis unit and transmits the force to the hand of the operator.

In further detail, the model conversion unit converts the two component models in an assembled state into component analysis models composed of a plurality of mesh-divided elements;

the structure analysis unit determines contact surfaces of the two component analysis models, executes a structure analysis calculation so that, with respect to movement of the contact surface of one of the component analysis models, the contact surface of the other structure analysis model does not penetrate into each other, and obtains deformation, distortion, and stress of each element and deformation of entire models; and the disassembly evaluation processing unit searches a maximum deformation stress from among deformation stresses of the mesh constituting the deformed component analysis model, compares the stress with a rupture stress of the component which is set in advance, and performs alert display of rupture of the component when the stress is determined to exceed the rupture stress.

The disassembly evaluation processing unit further has a stress color conversion unit which converts deformation stress of the mesh constituting the deformed component analysis model into color information; and a stress distribution display unit which displays stress distribution with respect to an arbitrary cross section of the component analysis model according to the color information.

The present invention provides a disassembling manipulability evaluation apparatus. The disassembling manipulability evaluation apparatus has an analysis model control unit which disposes a product model including at least two component models to be evaluated in virtual space displayed in a screen;

a virtual operation control unit which moves and operates to disassemble the component model from the product model disposed in the virtual space in accordance with an input operation signal from outside;

a model conversion unit which converts the two component models constituting the product model into component analysis models;

a deformed structure analysis unit which executes a structure analysis calculation with respect to relative movement which disassembles the two component analysis models and deforms the models; and an evaluation processing unit which evaluates disassembling manipulability based on the result of the structure analysis calculation of the component analysis model.

(Method)

The present invention provides an assembling manipulability evaluation method. The assembling manipulability evaluation method of the present invention is characterized by including a virtual operation control step in which a component model disposed in virtual space is moved and operated in accordance with an input operation signal from outside;

an analysis model control step in which at least two component models, which are to be used in assembly of a product to be evaluated, are disposed in the virtual space displayed in a screen;

a virtual operation control step in which the two component models disposed in the virtual space are relatively moved in accordance with an input operation signal from outside so as to perform assembling movement;

a deformed structure analysis step in which a structure analysis calculation is executed with respect to relative movement caused along with assembly of the two component analysis models after the contact and the models are deformed; and an evaluation processing step in which assembling manipulability is evaluated based on the result of the structure analysis calculation of the component analysis model.

The present invention provides a disassembling manipulability evaluation method. The disassembling manipulability evaluation method of the present invention is characterized by executing an analysis model control step in which a product model including at least two component models to be evaluated are disposed in virtual space displayed in a screen;

a virtual operation control step in which the component model is moved and operated to disassemble from the product model disposed in the virtual space in accordance with an input operation signal from outside;

a model conversion step in which the two component models constituting the assembly model are converted into component analysis models;

a deformed structure analysis step in which a structure analysis calculation is executed with respect to relative movement caused along with disassembly of the two component analysis models and the models are deformed; and an evaluation processing step in which disassembling manipulability is evaluated based on the result of the structure analysis calculation of the component analysis model.

(Program)

The present invention provides an assembling manipulability evaluation program. The assembling manipulability evaluation program of the present invention is characterized by causing a computer to execute an analysis model control step in which at least two component models, which are to be used in assembly of a product to be evaluated, are disposed in virtual space displayed in a screen;

a virtual operation control step in which the component model disposed in the virtual space is moved and operated in accordance with an input operation signal from outside;

a model conversion step in which the two component models are converted into component analysis models when the two component models are brought into contact with each other;

a deformed structure analysis step in which a structure analysis calculation is executed with respect to relative movement caused along with assembly of the two component analysis models after the contact and the models are deformed; and an evaluation processing step in which assembling manipulability is evaluated based on the result of the structure analysis calculation of the component analysis model.

The present invention provides a disassembling manipulability evaluation program. The disassembling manipulability evaluation program of the present invention is characterized by causing a computer to execute an analysis model control step in which a product model including at least two component models to be evaluated is disposed in virtual space displayed in a screen;

a virtual operation control step in which the component model is moved and operated to disassemble from the product model disposed in the virtual space in accordance with an input operation signal from outside;

a model conversion step in which the two component models constituting the assembly model are converted into component analysis models;

a deformed structure analysis step in which a structure analysis calculation is executed with respect to relative movement which is caused along with disassembly of the two component analysis models, and the models are deformed; and a disassembling manipulability evaluation processing step in which disassembling manipulability is evaluated based on the result of the structure analysis calculation of the component analysis model.

According to the present invention, regarding an assembling operation in virtual space in which component models are assembled while they are deformed, until the component models are brought into contact with each other, they are moved corresponding to the movement of the hand of the user as rigid component models which are not deformed so that they do not interfere with each other, they are converted into component analysis models when the component models are brought into contact with each other, and, from this stage, structure analysis calculations are sequentially executed with respect to the movement of the component analysis models caused along with the assembling operation, thereby obtaining distortion, deformation stresses, and deformation of the component models upon assembly in the virtual space; and, when the deformation stresses are compared with the rupture stress of the component model, evaluation that whether the assembling operation can be appropriately performed or not without breaking the components can be performed.

Also, regarding a disassembling operation of a product model in virtual space, component models constituting the product are converted into component analysis models, and distortion, deformation stresses, and deformation are obtained by similarly and sequentially executing structure analysis calculations with respect to movement of the component analysis models caused along with disassembly; and, when the deformation stresses and the rupture stress of the component model are compared, evaluation that whether the disassembling operation can be appropriately performed or not without breaking the components can be performed. The above and other objects, features, and advantages of the present invention will become more apparent from the following detailed description with reference to the drawings.

BRIEF DESCRIPTION OF THE DRAWINGS

FIGS. 13A to 13C are explanatory diagrams showing stress distribution display along with progress of assembling obtained in the deformed structure analysis process of the present embodiment;

FIGS. 15A to 15C are explanatory diagrams showing stress distribution display along with progress of disassembling obtained in a deformed structure analysis process of the present embodiment.

DETAILED DESCRIPTION OF THE PREFERRED EMBODIMENTS

Figure 1:
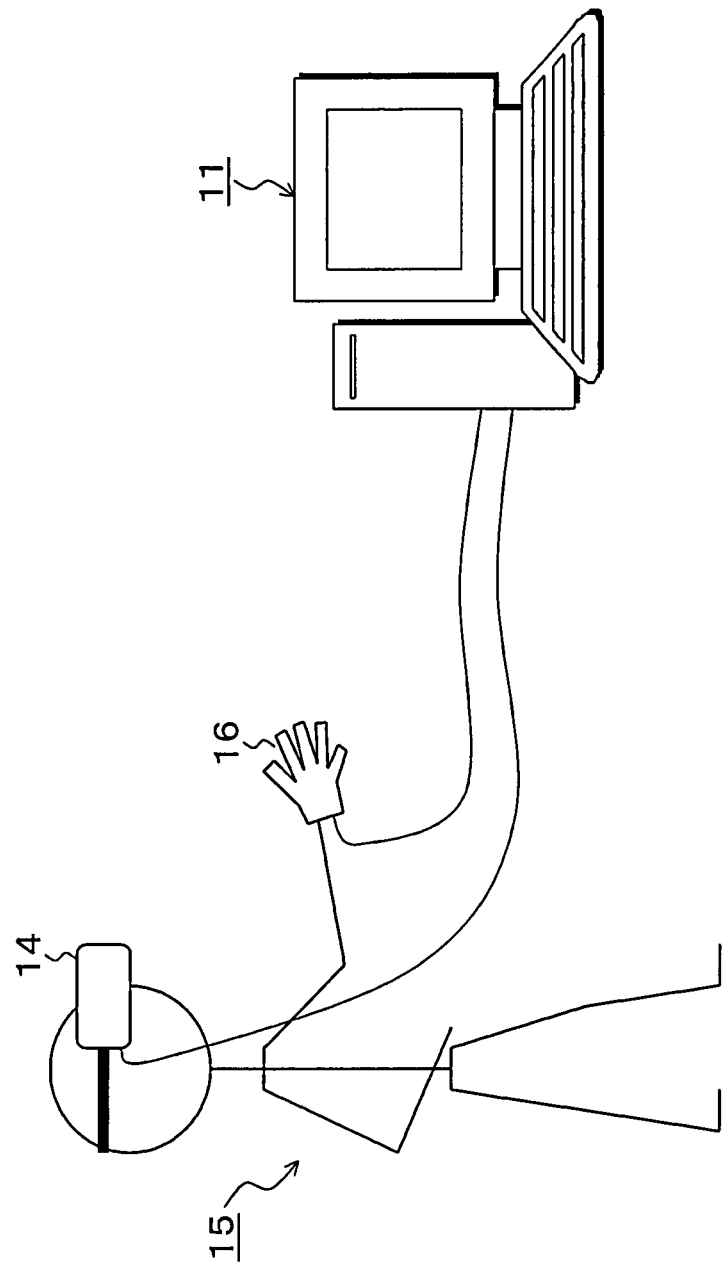
FIG. 1 is an explanatory drawing showing a usage state of an assembling manipulability evaluation apparatus according to the present invention.

FIG. 1 is an explanatory diagram showing a usage state of an assembling manipulability evaluation apparatus according to the present invention. In FIG. 1, the assembling manipulability evaluation apparatus 11 of the present embodiment can perform assembling manipulability evaluation by executing a program by a personal computer. A user 15 who is a tester wears a head-mounted display 14, which is used as a display device, and a virtual glove 16, and each of them is connected to the assembling manipulability evaluation apparatus 11 by a signal line. The virtual glove 16 detects the movement of the hand of the user 15 and inputs a detection signal to the assembling manipulability evaluation apparatus 11, and a feedback signal based on the reaction force corresponding to the movement of objects in virtual space of an assembling manipulability evaluation process is returned to the virtual glove 16, thereby giving reaction force to the hand of the user 15. For example, "Cyber Glass" sold by ASAHI ELECTRONICS CO., LTD. The head-mounted display 14 displays images of the objects formed in the virtual space by the assembly evaluation process in the assembling manipulability evaluation apparatus 11 using the computer so that they can be seen by the user 15. For example, "nVisor SX" produced by InterSense, Inc. (Intersense) can be used as the head-mounted display 14.

Figure 2:
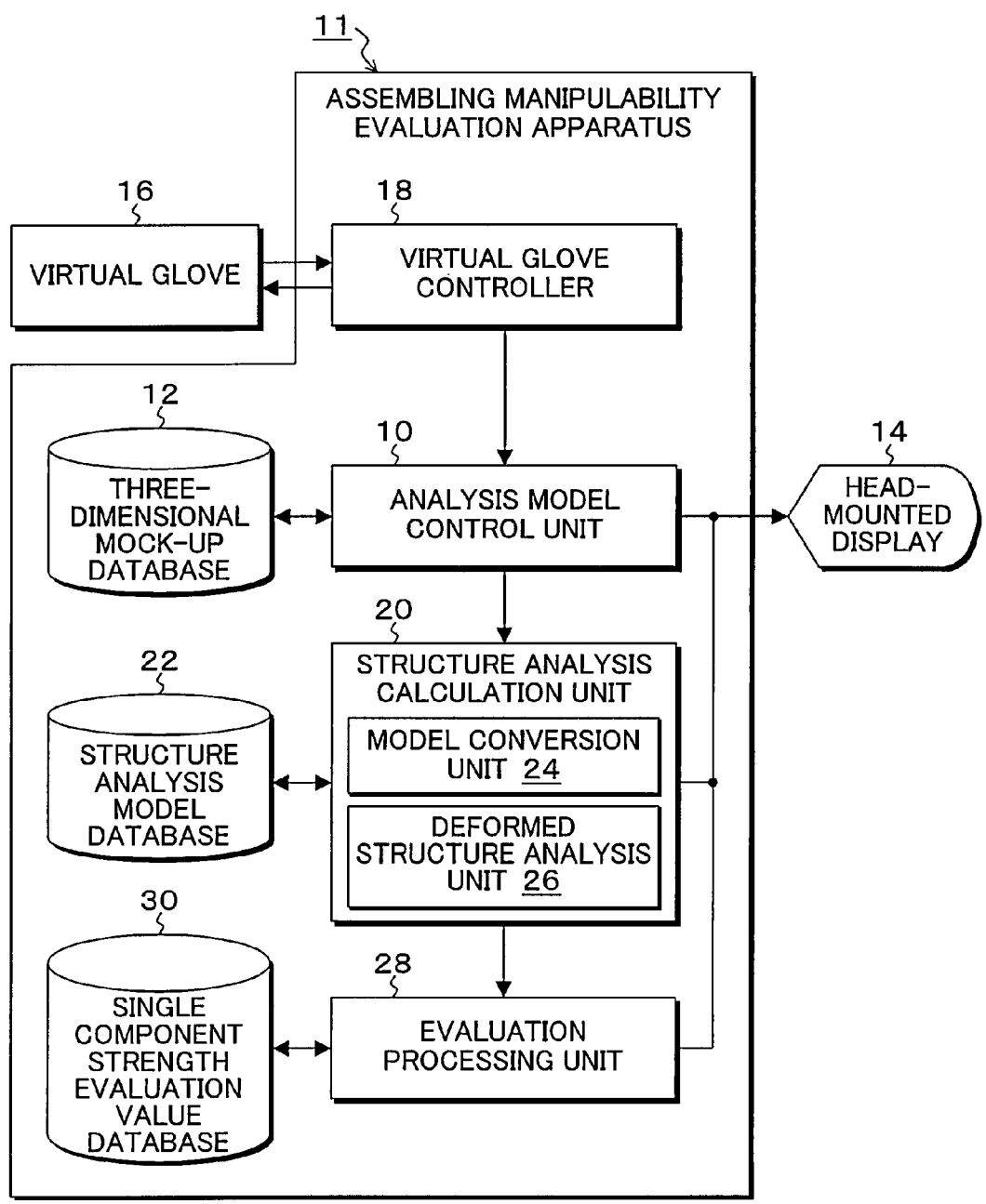
FIG. 2 is a block diagram of a functional configuration showing an embodiment of the assembling manipulability evaluation apparatus according to the present invention.

FIG. 2 is a block diagram of a functional configuration showing an embodiment of the assembly evaluation apparatus according to the present invention, wherein functions are realized by executing a program installed in the assembling manipulability evaluation apparatus 11 described in FIG. 1. In FIG. 2, in the assembling manipulability evaluation apparatus 11 of the present embodiment, an analysis model control unit 10, a three-dimensional mock-up database 12, a virtual glove controller 18, a structure analysis calculation unit 20, a structure model database 22, an evaluation processing unit 28, and a single component strength evaluation value database 30 are provided. The analysis model control unit 10 generates and disposes at least two component models, which are to be used in assembly of a product to be evaluated, in virtual space of the computer, which is displayed on the screen of the head-mounted display 14, based on mock-up data of the three-dimensional mock-up database 12. The virtual glove controller 18 functions as a virtual operation control unit and moves/operates the component models, which are disposed in the virtual space of the assembling manipulability evaluation apparatus 11 by the analysis model control unit 10, in accordance with an input operation signal from the external virtual glove 16. More specifically, the virtual glove controller 18 has functions as a detection unit which detects the movement of the hand of the user and outputs a detection signal, a virtual assembly unit which disposes the virtual glove in the virtual space and moves the virtual glove in accordance with the detection signal of the movement of the hand so as to perform an assembling operation, and a reaction force feedback unit which calculates reaction force from the deformation stress of component analysis models calculated by the structure analysis calculation unit 20 and transmits that to the hand of the user. In the structure analysis calculation unit 20, a model conversion unit 24 and a deformed structure analysis unit 26 are provided. When one of the at least two component models, which are disposed in the virtual space by the analysis model control unit 10, is held by an operation of the virtual glove 16 so as to move it to the other component model and perform assembly, and the two component models are brought into contact with each other, the model conversion unit 24 converts the two component models into component analysis models for structure analysis. Herein, in the structure analysis calculation unit 20, structure analysis by means of the finite element method is performed; therefore, the model conversion unit 24 converts the two component modes into the component analysis models composed of a plurality of mesh-divided elements. The model conversion of the present embodiment uses mesh-divided models which are prepared in advance in the structure analysis model database 22. The deformed structure analysis unit 26 executes structure analysis calculations in accordance with the finite element method upon relative movement caused along with assembly of the two component analysis models after the contact and deforms the component analysis models. As a result of the analysis calculations by means of the finite element method for deformed structure analysis, transformation, distortion, and deformation stresses of each of the elements constituting the component analysis models can be calculated, and deformation as whole models can be obtained by integrating the calculation amounts of the elements. The evaluation processing unit 28 evaluates assembling manipulability based on the result of the structure analysis calculations by the deformed structure analysis unit 26 accompanied by deformation of the component analysis models. Specifically, it searches a maximum deformation stress from the deformation stresses of the elements constituting the deformed component analysis model and compares it with a rupture stress (threshold stress) which is stored in the single component strength evaluation value database 30 and determined from the material of the corresponding component; and, when it is determined to exceed the rupture stress, the unit recognizes breakage of the component and displays an alert in the head-mounted display 14. Also, as another evaluation process by the evaluation processing unit 28, the deformation stresses of the elements constituting the component analysis models, which are deformed, can be converted into color information corresponding to the stresses, and the stress distribution can be displayed with respect to an arbitrary cross section of the component analysis model according to the converted color information. Such display of the stress distribution in the component analysis models is not performed by the head-mounted display 14 but by a display of the computer that is used as the assembling manipulability evaluation apparatus 11 shown in FIG. 1.

Figure 3:
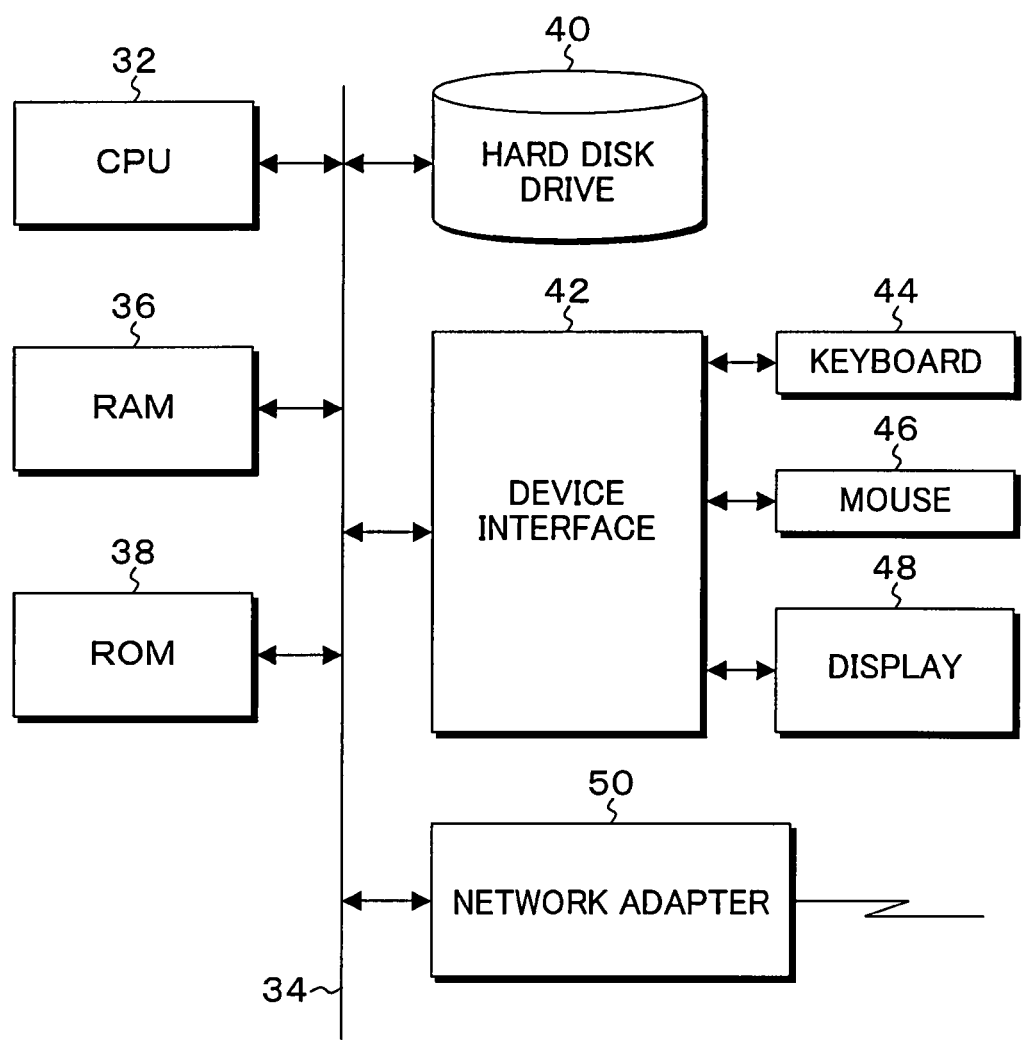
FIG. 3 is a block diagram showing a hardware environment of a computer in which an assembling manipulability evaluation program of the present embodiment is executed.

FIG. 3 is a block diagram showing a hardware environment of the computer in which an assembling manipulability evaluation program of the present embodiment is executed. In FIG. 3, the computer has a CPU 32; and a RAM 36, a ROM 38, a hard disk drive 40, a device interface 42 connected to a keyboard 44, a mouse 46, and a display 48, and a network adapter 50 connected to a LAN or the like are connected to a bus 34 of the CPU 32. The assembling manipulability evaluation program of the present embodiment is installed in the hard disk drive 40. When the computer is started up, an OS is read and allocated from the hard disk drive 40 to the RAM 36 by a boot process; and, when the OS is launched, the assembling manipulability evaluation program of the present embodiment is read and allocated from the hard disk drive 40 to the RAM 36 and executed by the CPU 32.

Figure 4:
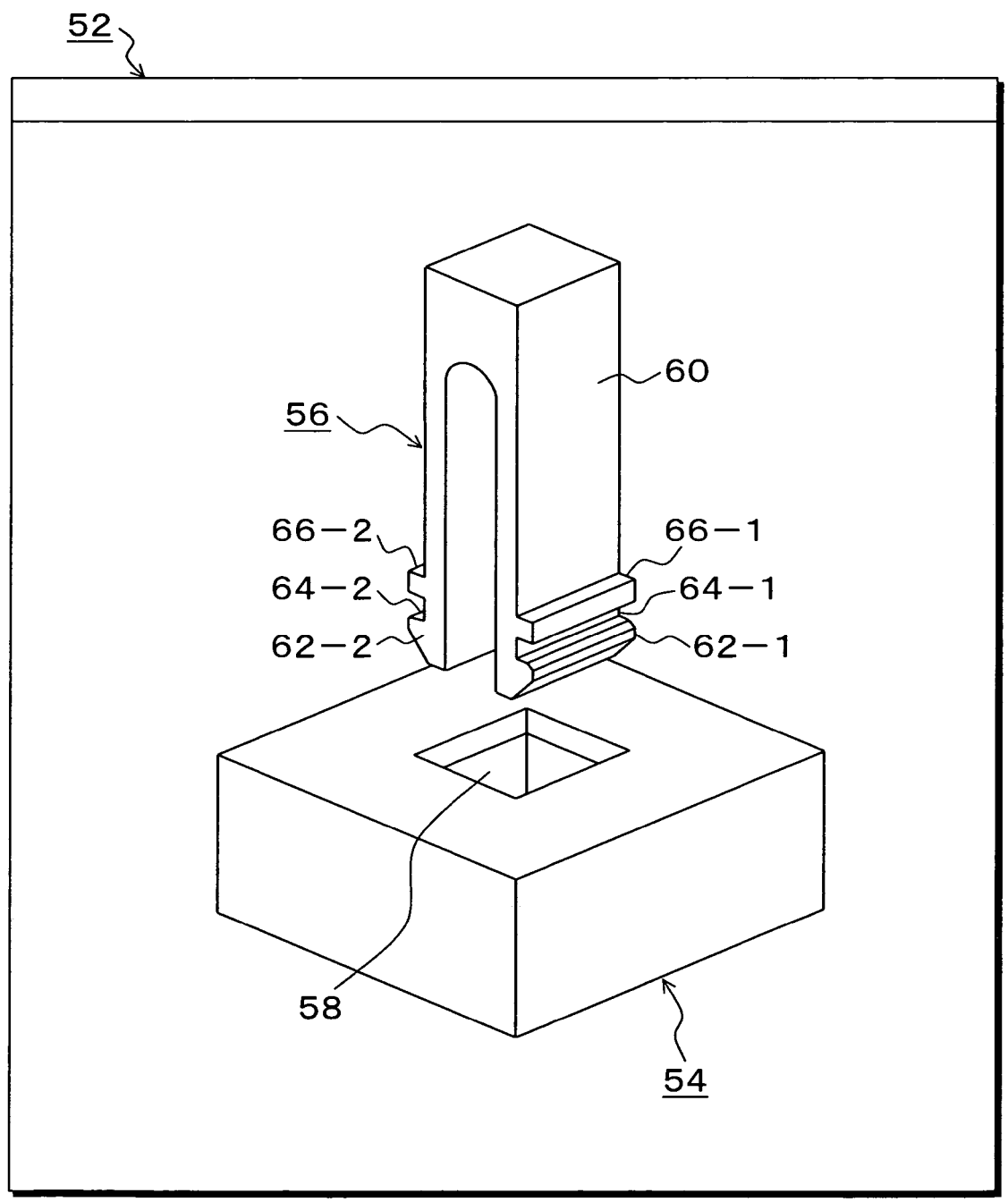
FIG. 4 is an explanatory drawing of a display screen of component models before assembling in the present embodiment.

FIG. 4 is an explanatory diagram of a display screen of component models before assembly in the present embodiment. In FIG. 4, a component model 54 and a component model 56 serving as evaluation objects are displayed in the display screen 52 of the head-mounted display 14. The component models 54 and 56 are generated and displayed based on the three-dimensional mock-up database 12 of FIG. 2.

Figure 5:
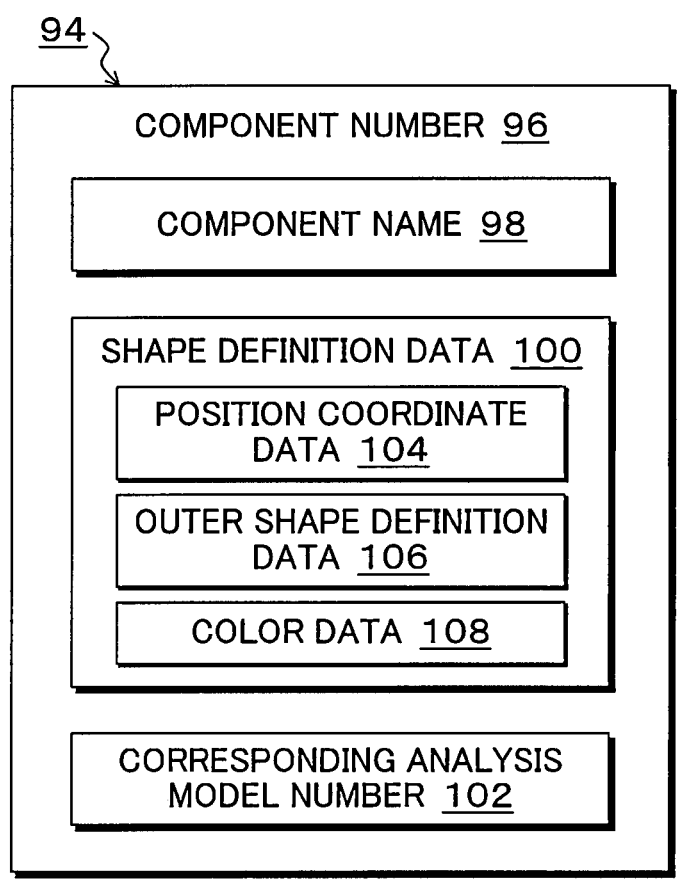
FIG. 5 is an explanatory diagram of a mock-up data structure forming a component model of the present embodiment.

FIG. 5 is an explanatory diagram of a mock-up data structure which is stored in the mock-up database 12 for displaying the component model 54 or 56 of FIG. 4. In FIG. 5, the mock-up data structure 94 is generated for each component and has a component number 96 serving as an index, a component name 98, shape definition data 100, and a corresponding analysis model number 102. In the shape definition data 100, position coordinate data 104, outer shape definition data 106, and color data 108 are disposed. Such mock-up data structure 94 can be automatically formed by three-dimensional CAD from design data. Referring again to FIG. 4, the component model 54 displayed in the display screen 52 has a rectangular engagement hole 58 in the upper part. Meanwhile, the component model 56 forms claw portions 62-1 and 62-2 which are separated into two at lower part of a main body portion 60 and has stopper portions 66-1 and 66-2 behind the claw portions 62-1 and 62-2 via engagement grooves 64-1 and 64-2. The user 15 shown in FIG. 1 operates the virtual glove 16 in the state in which the component models 54 and 56 of FIG. 4 are displayed in the head-mounted display 14, grasps the main body portion 60 of the component model 56 by the virtual glove 16 in the state in which the component model 54 side is fixed, and performs an assembling operation of engaging the claw portions 62-1 and 62-2 at the distal ends in the engagement hole 58 of the component model 54. In an actual display process, an image of the hand of the user corresponding to the virtual glove 16 is displayed in the virtual space of the display screen 52 of FIG. 4, and the assembling operation of engaging the it in the engagement hole 58 of the component model 54 by grasping the main body portion 60 of the component model 56 is performed by movement of the image of the hand in the virtual space.

Figure 6:
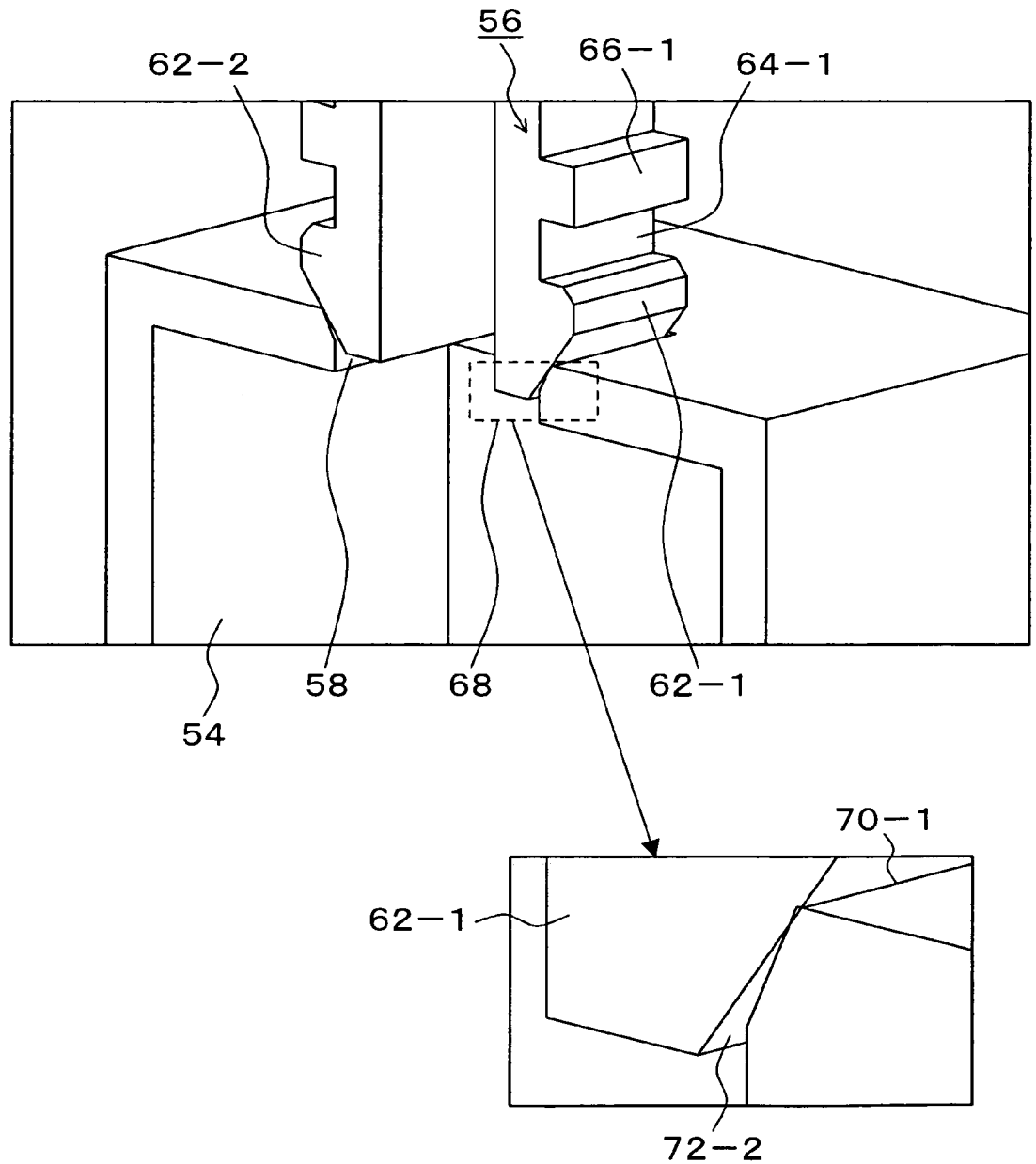
FIG. 6 is an explanatory drawing of a display state in which component models are moved and brought into contact in the present embodiment.

FIG. 6 shows the state in which the claw portions 62-1 and 62-2 at the distal ends of the component model 56 are brought closer to and brought into contact with the engagement hole 58 of the component model 54 in the virtual space. In the contact state of the component model 56 with respect to the component model 54, as a contact part 68 shown by a dotted line is enlarged and shown in the lower side, a tapered surface 72-2 of the claw portion 62-1 in the component model 56 side is in contact with an open edge 70-1 at the engagement hole 58 of the component model 54. The contact like that of FIG. 6 that is caused along with assembly of the component model 56 with respect to the component model 54 is determined when the relative distance between the component model 54 and the component model 56 becomes zero. When the contact of the component models 54 and 56 is determined, the model conversion unit 24 provided in the structure analysis calculation unit 20 of FIG. 2 converts the component models 54 and 56, which are generated and displayed as three-dimensional mock-up models, into component analysis models, which are composed of a plurality of mesh-divided elements serving as objects of structure analysis according to the finite element method.

Figure 7:
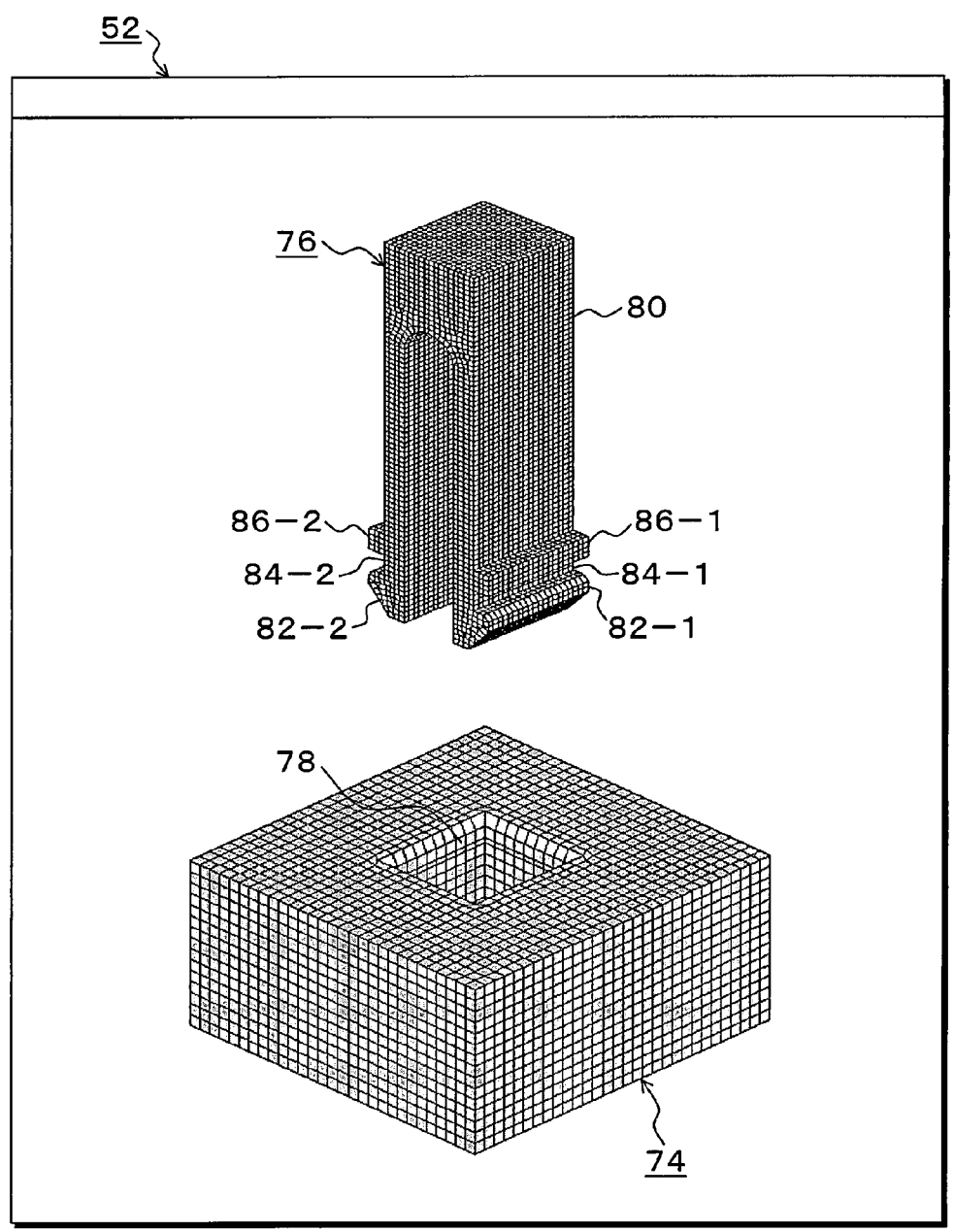
FIG. 7 is an explanatory drawing of component analysis models converted from the component models in the present embodiment.

FIG. 7 shows the component analysis models converted upon the contact determination of the component models 54 and 56. In the display screen 52 of FIG. 7, the component analysis model 76 corresponding to the component model 56 of FIG. 4 and the component analysis model 74 corresponding to the component model 54 of FIG. 4 are shown. In the present embodiment, the component analysis models 74 and 76 are composed of a plurality of elements which are mesh-divided into miniature hexahedrons. An engagement hole 78 is provided in the component analysis model 74. The component analysis model 74 forms claw portions 82-1 and 82-2 at distal ends of arm portions which are downwardly separated from a main body portion 80 in a U-shape and has stopper portions 86-1 and 86-2 which are continued to the claw portions 82-1 and 82-2 via engagement grooves 84-1 and 84-2.

Figure 8:
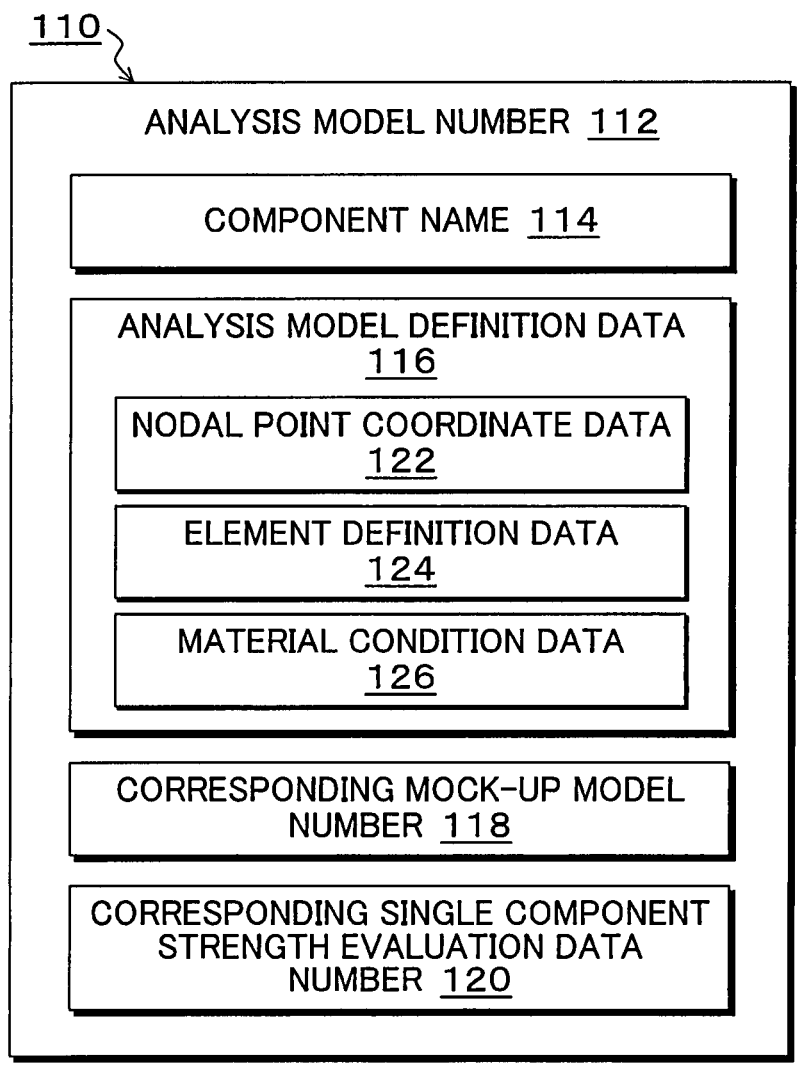
FIG. 8 is an explanatory diagram of an analysis model data structure forming a component analysis model in the present embodiment.

FIG. 8 shows an analysis model data structure 110 stored in the structure analysis model database 22 of FIG. 2 from which the component analysis models 74 and 76 of FIG. 7 are generated and displayed. In FIG. 8, the analysis model data structure 110 is generated for each model and has an analysis model number 112 serving as an index, a component name 114, analysis model definition data 116, a corresponding mock-up model number 118, and a corresponding single component strength evaluation data number 120. As conditions for realizing calculations of finite element structure analysis, nodal point coordinate data 122, element definition data 124, corresponding condition data 126 is disposed in the analysis model definition data 116. The component number 96 of the mock-up data structure 94 of FIG. 5 is disposed as the corresponding mock-up model number 118. Also, a single component strength evaluation data number 130 in a single component strength evaluation structure 128 of FIG. 10, which will be elucidated in later description, is disposed as the corresponding single component strength evaluation data number 120.

Figure 9:
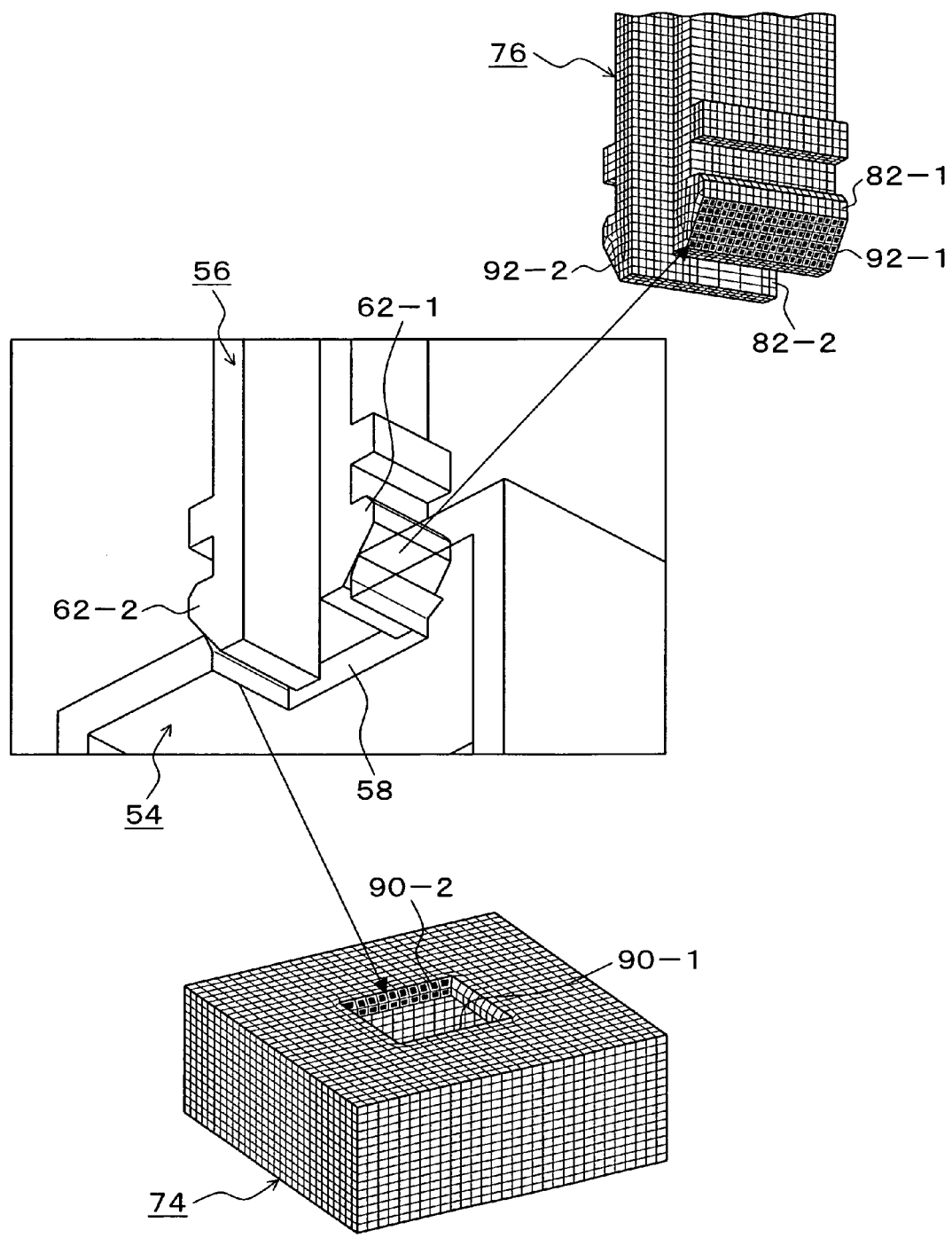
FIG. 9 is an explanatory drawing of the component analysis models in which contact surfaces of the component models are detected and deformed structure analysis is executed in the present embodiment.

FIG. 9 shows an automatic determination process of contact surfaces for deformed structure analysis calculations in the component models 54 and 56 shown in FIG. 6 and the component analysis models 74 and 76, which are converted upon contact determination therebetween. In FIG. 9, when the component model 56 is assembled with and moved to the component model 54 so as to bring them into contact, the part at which the relative distance between them becomes zero can be recognized as the surfaces which caused interference, and the element surfaces of the component analysis models 74 and 76 corresponding to the surfaces at which interference is recognized are automatically recognized so as to set contact surfaces. In the case of FIG. 9, open edges 90-1 and 90-2 in the component analysis model 74 and tapered surfaces 92-1 and 92-2 of the claw portions 82-1 and 82-2 in the component analysis model 76 are set as the contact surfaces. When the contact surfaces are set in this manner with respect to the component analysis models 74 and 76, with respect to movement caused along attachment of the component analysis model 76 wherein the component analysis model 74 serves as a fixed side, structure calculations wherein the two component analysis models 74 and 76 are deformed so that they do not penetrate into each other are executed by the finite element method. Herein, a structure analysis procedure according to the finite element method for executing the structure calculations wherein the two component models are deformed so that they do not penetrate into each other will be simply described below.

(1) The component models are decomposed into a plurality of elements according to matrix rigidity, and boundary conditions are set.
(2) Element rigidity matrices are calculated.
(3) An entire rigidity matrix is calculated.
(4) An equivalent nodal force change axis is introduced.
(5) Linear simultaneous equations are solved to obtain node displacement.
(6) Distortion and stress are calculated from the node displacement.
(7) Calculation results are output and visualized. When it is described in further detail, the component models serving as evaluation objects are converted into the component analysis models 74 and 76 through mesh-division into a plurality of elements as shown in FIG. 7, and material definition and boundary condition are set. Specifically, the process can be performed by reading the analysis model data structure 110 for each model shown in FIG. 8. Subsequently, element rigidity matrices $[K^e]$ are generated for the read analysis model data structures 110. The element rigidity matrices $[K^e]$ are overlapped to generate an entire rigidity matrix [K]. Then, surface stress vectors are subjected to area integration to calculation equivalent nodal force vectors [f]. The boundary conditions of displacement constraint are approximately introduced by multiplication by large numbers. When the thus generated linear simultaneous equations $$[K]\{d\}=[f]$$

are solved, the nodal displacement vector [d] is determined. Furthermore, distortion/displacement relation equations $$[\epsilon]=[B][d]$$

are used to calculate distortion of each element. Furthermore, stress/distortion relation equations $$\{\sigma\}=[D]\{\epsilon\}$$

are used to calculate the stress of each element. Finally, the calculation results are output as a file, and visualization on the screen can be performed based on the result file to display the deformation state or stress distribution of the models.

Figure 10:
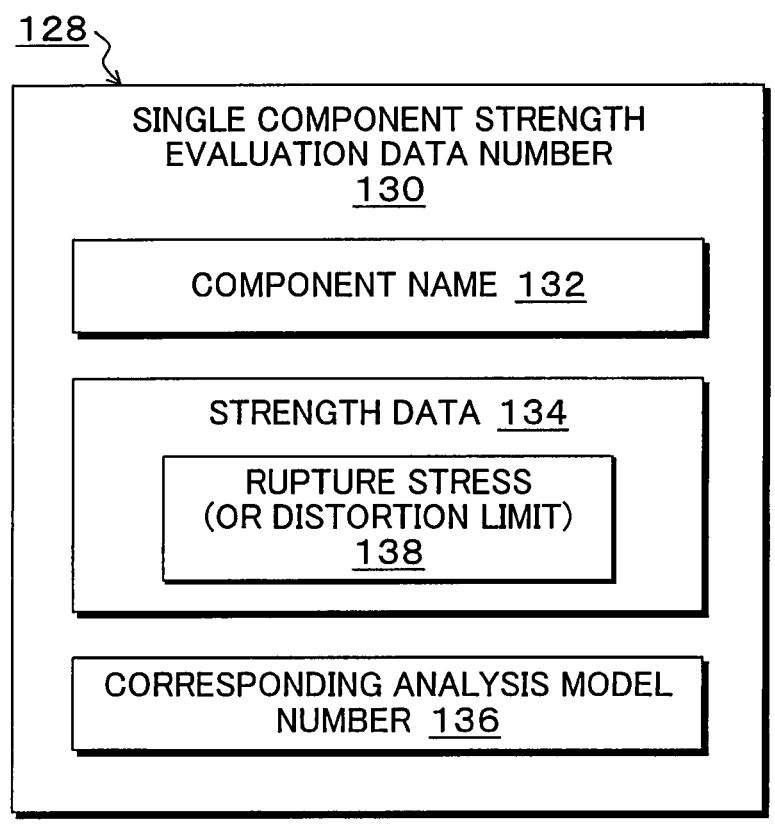
FIG. 10 is an explanatory diagram of a single component strength evaluation data structure used in an evaluation process of the present embodiment.

FIG. 10 shows a single component strength evaluation data structure stored in the single component strength evaluation value database used in the evaluation process of the evaluation processing unit 28 of FIG. 2. In FIG. 10, the single component strength evaluation data structure 128 is generated for each component, and the single component strength evaluation data number 130 serving as an index, a component name 132, strength data 134, and a corresponding analysis model number 136 are disposed. In the strength data 134, a rupture stress 138 or distortion limit is stored.

Figure 11:
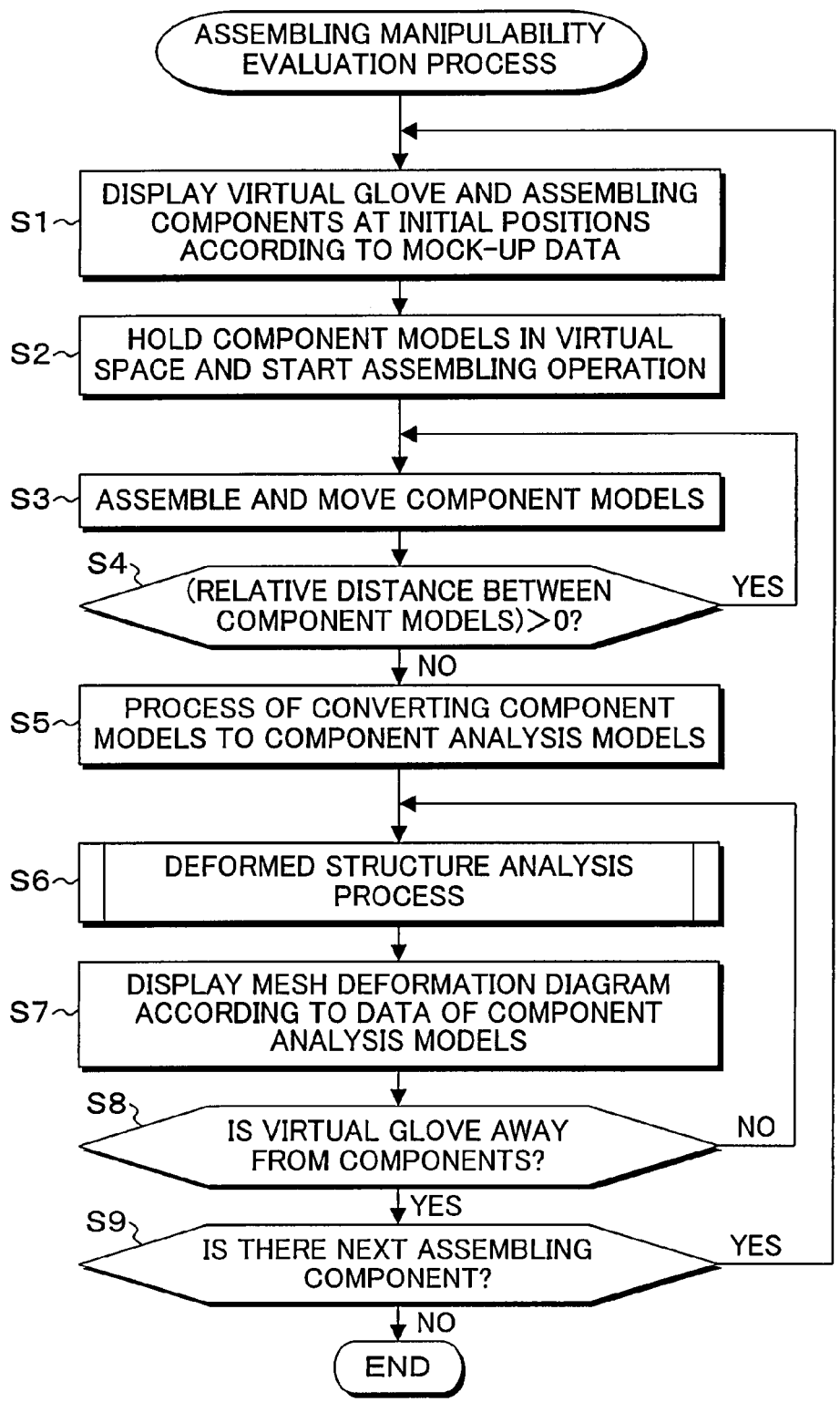
FIG. 11 is a flow chart showing an assembling manipulability evaluation process according to the present embodiment.

FIG. 11 is a flow chart showing the assembling manipulability evaluation process according to the present embodiment, and it will be described below with reference to FIG. 2. In FIG. 11, when the assembling manipulability evaluation program is executed by the computer, which functions as the assembling manipulability evaluation apparatus 11 of the present embodiment, in the state in which the user 15 shown in FIG. 1 wears the head-mounted display 14 and the virtual glove 16, in step S1, the analysis model control unit 10 generates the virtual glove and assembling components in virtual space of the computer based on the mock-up data of the three-dimensional mock-up database 12, disposes them for example in the manner shown in FIG. 4, and displays them in the head-mounted display 14. Subsequently, in step S2, the user operates the virtual glove 16, disposes the component models in the virtual space, and start an assembling operation. In step S3, along with this assembly, the component model is moved corresponding to the movement of the virtual glove; and, in step S4, with respect to the movement of the component model, whether the relative distance between the assembling components is larger than zero or not is determined. When it is determined in step S4 that the relative distance between the assembling components reaches zero, the process proceeds to step S5, in which the three-dimensional mock-up components are converted into, for example, the mesh-divided component analysis models 74 and 76 shown in FIG. 7, which serve as analysis objects of the finite element method, by the model conversion unit 24 provided in the structure analysis calculation unit 20 by using the data of the structure analysis model database 22. Subsequently, in step S6, in accordance with the relative movement of the component analysis model caused along with the assembly, structure analysis calculations in accordance with the finite element method for deforming the model shape are performed by the deformed structure analysis unit 26. As analysis results of the deformed structure analysis, the deformation, distortion, and stress of each of the elements are calculated, and deformation as a whole can be further calculated. Subsequently, after a mesh deformation diagram is generated from the analysis model data and displayed in step S7, whether the virtual glove is away from the component or not is determined in step S8, and the processes from step S6 are sequentially repeated until the virtual glove gets away therefrom because of assembly completion. When it is determined in step S8 that the virtual glove has gotten away from the component, assembly completion is recognized, and whether there is a next assembling component or not is checked in step S9; and, when there is a next assembling component, the process returns to step S1, and similar processes are repeated for the new assembling component. When there is no more assembling component, the series of processes is finished.

Figure 12:
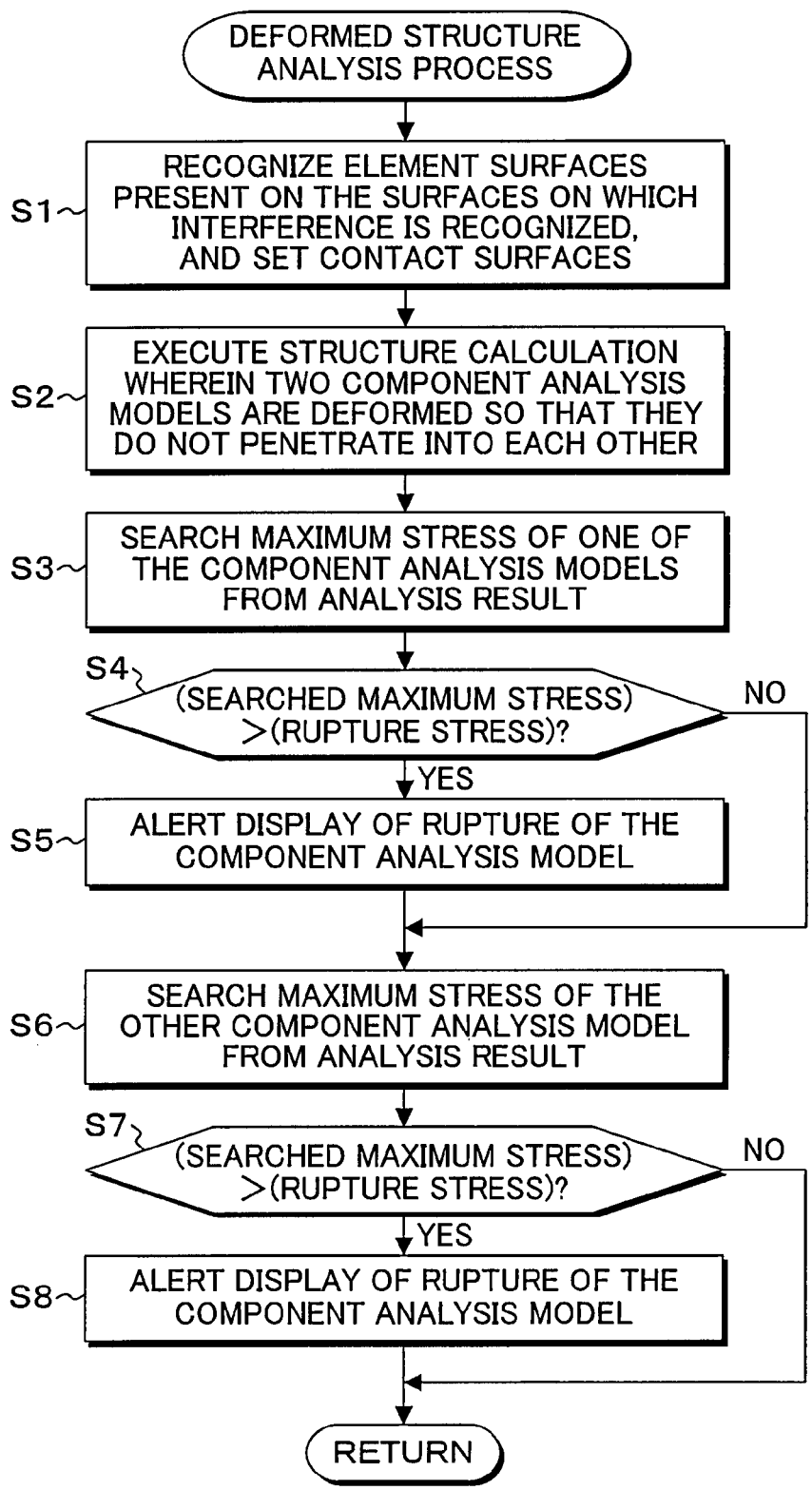
FIG. 12 is a flow chart showing details of the deformed structure analysis process in step s6 of FIG. 11.

FIG. 12 is a flow chart showing the deformed structure analysis process in step S6 of FIG. 11. In FIG. 12, in the deformed structure analysis process, in step S1, as shown in FIG. 9, the element surfaces of the component models 54 and 56 at which the relative distance becomes zero and interference is recognized, in other words, the open edges 90-1 and 90-2 with respect to the component analysis model 74 and the tapered surfaces 92-1 and 92-2 outside the claw portions 82-1 and 82-2 are recognized with respect to the component analysis model 76, and the contact surfaces are set. Subsequently, in step S2, structure calculations wherein the two component analysis models 74 and 76 are deformed so that they do not penetrate into each other are executed according to the finite element method. The distortion, deformation and stress are calculated for each of the elements by the structure analysis calculations for the deformation process, and deformation as a whole model can be generated by integrating the deformation of the elements. Subsequently, in step S3, a maximum stress is detected from among the deformation stresses which are analysis results calculated for the elements constituting the component analysis model 74 of one side. Subsequently, in step S4, the maximum stress is compared with the rupture stress 138 in the strength data 134 in the single component strength evaluation data structure 128 shown in FIG. 10 which is corresponding to the component analysis model 74 and stored in the single component strength evaluation value database 30, and, when it exceeds the rupture stress, rupture of the component analysis model 74 is alerted and displayed in step S5. Subsequently, a maximum stress is similarly searched for the other component analysis model 76 in step S6, and, when it exceeds the corresponding material rupture stress in step S7, rupture of the component analysis model 76 is alerted and displayed in step S8. The processes of steps S4 to S8 are the processes by the evaluation processing unit 28 of FIG. 2; and, when alert display of the rupture is performed, the user 15 recognizes it is inappropriate, since the component is broken in the assembling operation at that time, and devises the method of the assembling operation so that rupture does not occur in the next time.

FIGS. 13A to 13C are explanatory diagrams showing stress distribution display along with the progress of assembly which is obtained in the deformed structure analysis process of FIG. 12. The deformed structure analysis process of FIG. 12 is sequentially executed along with the progress of the assembling operation caused along with the relative movement of the component analysis models, and deformed structure analysis data is generated as time-oriented data. With respect to the structure analysis data thus generated in the time-oriented manner, colors are converted so that, for example, the larger the stresses, the more the luminance or color saturation is increased, in accordance with the magnitude of the deformation stress calculated for each of the elements constituting the component analysis models, thereby displaying a stress distribution, for example, for cross sections at an assembling position of the structure analysis models. FIG. 13A shows stress distribution of beginning of insertion, wherein, since insertion of the claw portions 82-1 and 82-2 at the distal ends of the component analysis model 76 into the engagement groove 78 of the component analysis model 74 is started, stress-concentrated portions 140-1 and 140-2 are generated around the base part of the U-shaped part of the main body portion 80 which is divided into two. FIG. 13B shows stress distribution during insertion, wherein it can be understood that stress-concentrated portions 142-1 and 142-2 in the arm base part which is below the main body portion 80 of the component analysis model 76 are further increased. FIG. 13C shows a state after insertion, wherein the stress-concentrated portions in the component analysis model 76 side have completely disappeared since force is not applied.

Figure 14:
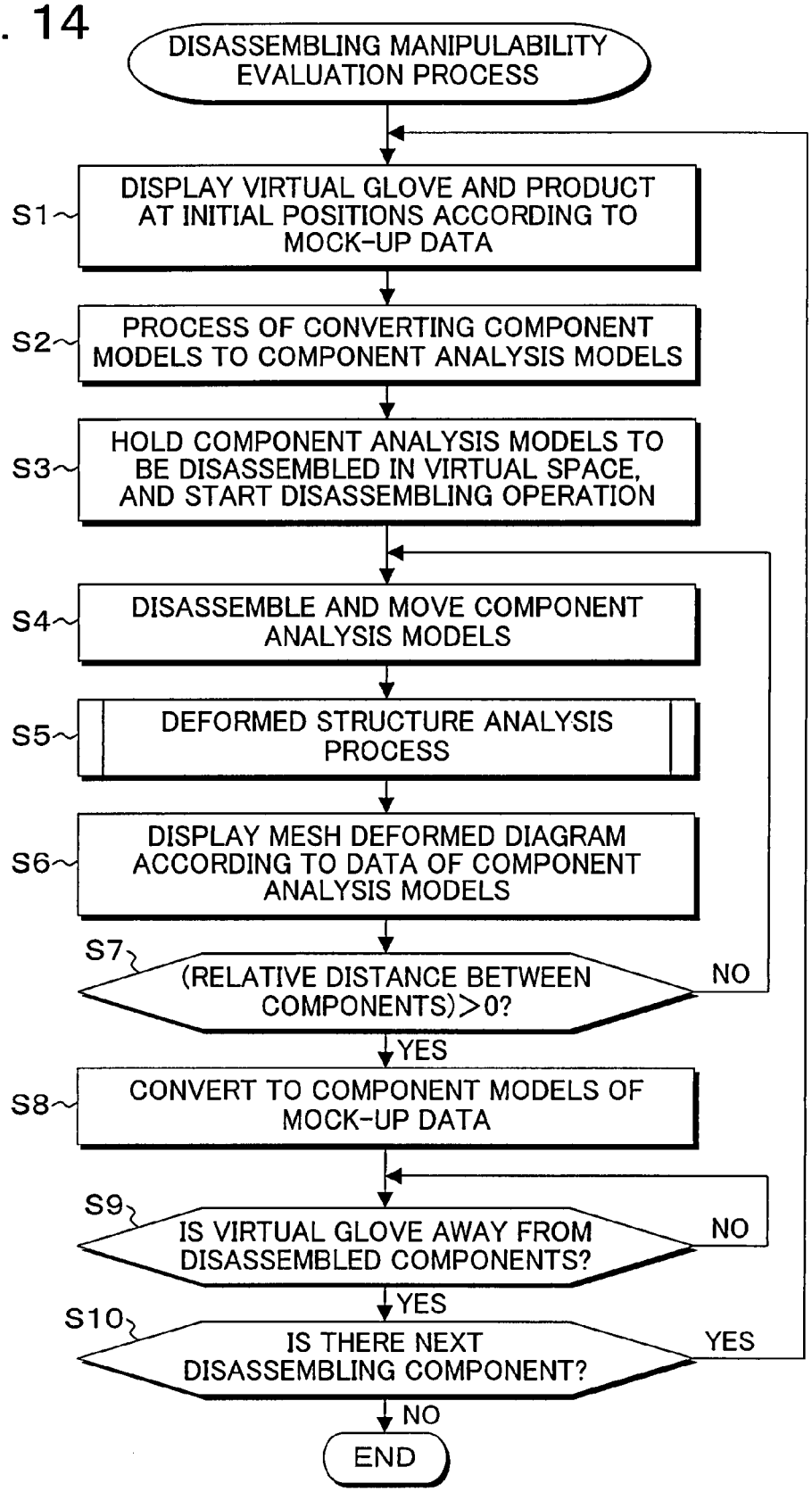
FIG. 14 is a flow chart showing a disassembling manipulability evaluation process according to the present embodiment.

FIG. 14 is a flow chart showing a disassembling manipulability evaluation process according to the present embodiment. The present invention evaluates manipulability upon assembly as shown in the flow chart of FIG. 11; however, a disassembling manipulability evaluation process can be performed by a similar deformed structure analysis process also for a disassembling operation of, inversely, removing a component from a product which is produced by assembling components in virtual space. The functions of the disassembling manipulability evaluation process can be realized basically by using, without modification, the assembling manipulability evaluation process shown in FIG. 2. More specifically, the analysis model control unit 10 disposes, together with the virtual glove, an assembly model including at least two component models of the product, which is to be evaluated, in the virtual space of the assembling manipulability display apparatus 11 which is displayed in the screen of, for example, the head-mounted display 14. In this state, in accordance with an input operation signal by the user, the virtual glove 16 performs a disassembling operation of removing the component model from the product model disposed in the virtual space. The model conversion unit 24 of the structure analysis calculation unit 20 converts at least two component models constituting the product model into component analysis models composed of mesh-divided elements. With respect to relative movement caused along with disassembly of the two component analysis models, the deformed structure analysis unit 26 executes structure analysis calculations in accordance with the finite element method so as to deform them and, at the same time, calculates the deformation, distortion, and stress of each of the elements. The evaluation processing unit 28 evaluates disassembling manipulability based on the results of the structure analysis calculations by the deformed structure analysis unit 26. Specifically, it searches a maximum stress from among deformation stresses of the elements of the component analysis models which are sequentially calculated during the disassembling operation, and compares it with the material rupture stress acquired from the single component strength evaluation value database 30; and, when it exceeds the material rupture stress, it recognizes rupture of the material and causes the head-mounted display 14 to perform alert display. Furthermore, the evaluation processing unit 28 converts the deformation stresses of the elements constituting the component analysis models, which are sequentially calculated along with the disassembling operation, into color information, thereby displaying, as evaluation information, the stress distribution in a predetermined cross section of the component analysis models during disassembly. The processing procedure as the present embodiment as such a disassembling manipulability evaluation apparatus will be described below with reference to the flow chart of FIG. 14. In FIG. 14, at the beginning, in step S1, the analysis model control unit 10 of FIG. 2 generates a virtual glove and a product model in virtual space of the assembling manipulability evaluation apparatus 11 based on the mock-up data of the three-dimensional mock-up database 12, disposes them at initial positions, and displays them in the head-mounted display 14. Subsequently, in step S2, the model conversion unit 24 of the structure analysis calculation unit 20 converts the two component models serving as disassembling objects in the product model disposed in the virtual space into mesh-divided component analysis models obtained from the structure analysis database 22. In this state, the process proceeds to step S3, in which the component analysis model to be disassembled in the virtual space is held by the virtual glove, and a disassembling operation is started. Along with the start of the disassembling operation, the disassembling component is moved in step S4, and a deformed structure analysis process is executed along with the movement of the disassembling component in step S5. The deformed structure analysis process in step S5 is basically same as the details of the deformed structure analysis process shown in FIG. 12. More specifically, as shown in FIG. 12, after the element surfaces at which interference occurs are recognized to set contact surfaces in step S1, structure analysis calculations wherein the two component models are deformed so that they do not penetrate into each other are executed in accordance with the finite element method in step S2, thereby obtaining the deformation, distortion, and stress of each of the elements. Subsequently, a maximum stress among the elements is detected from the analysis result of one of the component analysis models in step S3, it is compared with the material rupture stress stored in the single component strength evaluation value database 30 in step S4, and, when it exceeds the material rupture stress, rupture of the analysis component is alerted and displayed in step S5. Subsequently, a maximum stress is similarly detected for the other component analysis model in step S6, and, when it exceeds the material rupture stress in step S7, rupture of the analysis component is alerted and displayed in step S8. Referring again to FIG. 14, when the deformed structure analysis process is finished in step S5, a mesh deformation diagram is displayed according to the analysis model data in step S6, wherein deformation of the component models caused along with disassembly is displayed. Subsequently, in step S7, whether the relative distance between the assembling components is larger than zero or not is checked; and, when it is equal to or less than zero, it is determined to be during disassembly, and the processes from step S4 are repeated. When the relative distance exceeds zero, it is determined that the components are separated and disassembly is completed, and they are converted into mock-up data component models in step S8; and, when it is determined that the virtual glove has gotten away from the disassembling component in step S9, presence of a next disassembling component is checked in step S10, and the processes from step S1 are repeated if there is a disassembling component. If there is no disassembling component, the series of processes is terminated. Note that, although the component analysis models are converted into mock-up data component models after disassembly in step S8, this process is not always required, and the models after disassembly may be the component analysis models without change.

FIGS. 15A to 15C are explanatory diagrams showing stress distribution which is obtained in the disassembling manipulability evaluation process of the present embodiment of FIG. 14 and caused along with the progress of disassembly. FIG. 15A shows a state of beginning of disassembly, wherein stress-concentrated portions 144-1 and 144-2 are generated since a base part of the arm portion of the component analysis model 76 which is separated in a U-shape is pressed and caused to shrink by fingers of the virtual glove. FIG. 15B is during assembly, wherein stress-concentrated portions 146-1 and 146-2 are generated since the arm part of the component analysis model 76 is largely pressed toward inside, curved, and pulled upward. Also, with respect to the component analysis model 74 in the fixed side, stress-concentrated portions 148-1 and 148-2 are generated at inside corner parts in response to the stress which is caused along the disassembling pull-up of the component analysis model 76. FIG. 15C shows a state immediately after disassembly, wherein, since the component analysis model 76 is separated from the component analysis model 74 serving as a fixed side, the stress concentration in the component analysis model 74 side is eliminated, and stress-concentrated portions 150-1 and 150-2 are generated in the both side of the arm portion of the component analysis model 76 which is held by the virtual glove 16. As described above, in the present embodiment, not only upon assembly but also upon disassembly, disassembling manipulability can be similarly and appropriately evaluated by deformed structure analysis. The present invention also provides a storage medium storing the program executed by the computer. Herein, examples of the storage medium include card-type storage media and the like such as a CD-ROM, a Floppy Disk®, a DVD disk, a magneto-optical disk, and an IC card; storage apparatuses such as hard disk drives provided inside/outside a computer system; a database which retains programs via a line or another computer system and a database thereof; and a transmission medium on the line. Note that, the above embodiment takes the case, as an example, in which the user wears the virtual glove 16 as shown in FIG. 1 to experience a simulation of component assembly or component disassembly in virtual space; however, it goes without saying that assembly or disassembly using a tool can be performed by displaying the tool to be operated by the virtual glove 16 in the virtual space. Also, the present invention is not limited to assembly/disassembly, and the present invention can be applied, without modification, to an arbitrary operation as long as it is an operation in virtual space accompanied by deformation of a model(s). Moreover, the present invention includes arbitrary modifications that do not impair the object and advantages thereof and is not limited by the numerical values shown in the above described embodiment.

What is claimed is:

1. An assembling manipulability evaluation apparatus, comprising:
    an analysis model control unit which disposes at least two component models, which are to be used in assembly of a product to be evaluated, in virtual space displayed on a screen;
    a virtual operation control unit which moves and operates the component models disposed in the virtual space in accordance with an input operation signal from outside;
    a model conversion unit which determines contact between the two component models when a relative distance between the models becomes zero and converts the two component models into component analysis models composed of a plurality of mesh-divided elements;
    a deformed structure analysis unit which determines contact surfaces caused along with assembly of the two component analysis models, executes a structure analysis calculation so that, with respect to movement of the contact surface of one of the component analysis models, the contact surface of another structure analysis model does not penetrate into each other, and obtains deformation, distortion, and a stress of each element and deformation of an entire model; and
    an evaluation processing unit which searches a maximum deformation stress from among deformation stresses of the mesh constituting a deformed component analysis model, compares the stress with a rupture stress of a component which is set in advance, and performs alert display of rupture of the component when the stress is determined to exceed the rupture stress, and
    wherein the virtual operation control unit includes:
        a detection unit which detects movement of a hand of an operator and outputs a detection signal;
        a virtual assembly unit which disposes a virtual glove in the virtual space and moves the virtual glove in accordance with the detection signal so as to perform an assembling operation; and
        a reaction force feedback unit which calculates reaction force from a deformation stress of a component analysis model calculated by the deformed structure analysis unit and transmits the force to the hand of the operator.

2. The assembling manipulability evaluation apparatus according to claim 1, characterized in that the evaluation processing unit further has
    a stress color conversion unit which converts deformation stress of the mesh constituting the deformed component analysis model into color information; and
    a stress distribution display unit which displays stress distribution with respect to an arbitrary cross section of the component analysis model according to the color information.

3. The assembling manipulability evaluation apparatus described in claim 1, characterized by further having a disassembling manipulability evaluation processing unit which disassembles a component model from a product model, of which assembly is completed in the virtual space, and evaluates disassembling manipulability.

4. The assembling manipulability evaluation apparatus according to claim 3 characterized in that the disassembling manipulability evaluation processing unit has:
    the analysis model control unit which disposes the product model including at least two component models to be evaluated in virtual space displayed the screen;
    the virtual operation control unit which moves and operates to disassemble the component models from the product model disposed in the virtual space in accordance with an input operation signal from outside;
    the model conversion unit which converts the two component models constituting the product model into component analysis models composed of a plurality of mesh-divided elements;
    the deformed structure analysis unit which determines contact surfaces caused along with disassembly of the two component analysis models, executes a structure analysis calculation so that, with respect to movement of the contact surface of one of the component analysis models, the contact surface of another structure analysis model does not penetrate into each other, and obtains deformation, distortion, and a stress of each element and deformation of an entire model; and a disassembling manipulability evaluation processing unit which searches a maximum deformation stress from among deformation stresses of a mesh constituting a deformed component analysis model, compares the stress with a rupture stress of a component which is set in advance, and performs alert display of rupture of a component when the stress is determined to exceed the rupture stress.

5. The assembling manipulability evaluation apparatus according to claim 4, characterized in that the virtual operation control unit has:

the detection unit which detects movement of a hand of an operator and outputs a detection signal;

the virtual disassembly unit which disposes a virtual glove in the virtual space and moves the virtual glove in accordance with the detection signal so as to perform a disassembling operation; and the reaction force feedback unit which calculates reaction force from a deformation stress of the component analysis model calculated by the deformed structure analysis unit and transmits the force to the hand of the operator.

6. The assembling manipulability evaluation apparatus according to claim 4, characterized in that the disassembly evaluation processing unit further has a stress color conversion unit which converts the deformation stress of the mesh constituting the deformed component analysis model into color information; and a stress distribution display unit which displays a stress distribution with respect to an arbitrary cross section of the component analysis model according to the color information.

7. A disassembling manipulability evaluation apparatus characterized in that a disassembling manipulability evaluation processing unit has an analysis model control unit which disposes a product model including at least two component models to be evaluated in virtual space displayed on a screen;

a virtual operation control unit which moves and operates to disassemble the component models from the product model disposed in the virtual space in accordance with an input operation signal from outside;

a model conversion unit which converts the two component models constituting the product model into component analysis models composed of a plurality of mesh-divided elements;

a deformed structure analysis unit which determines contact surfaces caused along with disassembly of the two component analysis models, executes a structure analysis calculation so that, with respect to movement of the contact surface of one of the component analysis models, the contact surface of another structure analysis model does not penetrate into each other, and obtains deformation, distortion, and a stress of each element and deformation of an entire model; and an evaluation processing unit which searches a maximum deformation stress from among deformation stresses of the mesh constituting a deformed component analysis model, compares the stress with a rupture stress of a component which is set in advance, and performs alert display of rupture of the component when the stress is determined to exceed the rupture stress, and wherein the virtual operation control unit includes:

a detection unit which detects movement of a hand of an operator and outputs a detection signal;

a virtual assembly unit which disposes a virtual glove in the virtual space and moves the virtual glove in accordance with the detection signal so as to perform an assembling operation; and a reaction force feedback unit which calculates reaction force from a deformation stress of component analysis models calculated by the deformed structure analysis unit and transmits the force to the hand of the operator.

8. An assembling manipulability evaluation method, comprising:

executing an analysis model control in which at least two component models, which are to be used in assembly of a product to be evaluated, are disposed in virtual space displayed on a screen;

executing a virtual operation control in which the component models disposed in the virtual space are moved and operated in accordance with an input operation signal from outside;

executing a model conversion in which contact between the two component models are determined when a relative distance between the models become zero and the two component models are converted into component analysis models composed of a plurality of mesh-divided elements;

implementing a deformed structure analysis in which contact surfaces caused along with assembly of the two component analysis models are determined, a structure analysis calculation is executed so that, with respect to movement of the contact surface of one of the component analysis models, the contact surface of another structure analysis model does not penetrate into each other, and deformation, distortion, and a stress of each element and deformation of an entire model is obtained; and executing an evaluation process in which a maximum deformation stress is searched from among deformation stresses of the mesh constituting a deformed component analysis model, the stress is compared with a rupture stress of a component which is set in advance, and alert display of rupture of the component is performed when the stress is determined to exceed the rupture stress, and wherein said executing the virtual operation control includes:

detecting a movement of a hand of an operator, and outputting a detection signal;

disposing a virtual glove in the virtual space and moving the virtual glove in accordance with the detection signal so as to perform an assembling operation; and calculating a reaction force from a deformation stress of the component analysis models calculated in the deformed structure analysis and transmitting the force to the hand of the operator.

9. The assembling manipulability evaluation method according to claim 8, characterized in that the evaluation processing includes a stress color conversion operation in which the deformation stress of the mesh constituting the deformed component analysis model is converted into color information; and a stress distribution display operation in which a stress distribution with respect to an arbitrary cross section of the component analysis model is displayed according to the color information.

10. The assembling manipulability evaluation apparatus according to claim 8, characterized by further including a disassembling manipulability evaluation process in which a component model is disassembled from a product model, of which assembly is completed in virtual space, and disassembling manipulability is evaluated; wherein
the disassembling manipulability evaluation process includes:
an analysis model control operation in which the product model including at least two component models to be evaluated is disposed in virtual space displayed on the screen;
a virtual operation control operation in which the component model models is moved and operated to disassemble the model models from the product model disposed in the virtual space in accordance with an input operation signal from outside;
a model conversion operation in which the two component models constituting the product model are converted into component analysis models composed of a plurality of mesh-divided elements;
a deformed structure analysis operation in which contact surfaces caused along with disassembly component analysis models are determined, a structure analysis calculation is executed so that, with respect to movement of the contact surface of one of the component analysis models, the contact surface of another structure analysis model does not penetrate into each other, and deformation, distortion, and a stress of each element and deformation of an entire model is obtained; and
a disassembling manipulability evaluation processing in which a maximum deformation stress is searched from among deformation stresses of the mesh constituting the deformed component analysis model, the stress is compared with a rupture stress of the component which is set in advance, and alert display of rupture of the component is performed when the stress is determined to exceed the rupture stress.

11. A disassembling manipulability evaluation method characterized by executing an analysis model control in which a product model including comprises:
disposing at least two component models to be evaluated in a virtual space displayed on a screen;
controlling a virtual operation in which the component models are moved and operated to disassemble from the product model disposed in the virtual space in accordance with an input operation signal from outside;
executing a model conversion in which the two component models constituting the product model are converted into component analysis models composed of a plurality of mesh-divided elements;
analyzing a deformed structure in which contact surfaces caused along with disassembly component analysis models are determined, a structure analysis calculation is executed so that, with respect to movement of the contact surface of one of the component analysis models, the contact surface of another structure analysis model does not penetrate into each other, and deformation, distortion, and a stress of each element and deformation of an entire model is obtained; and
executing an evaluation processing in which a maximum deformation stress is searched from among deformation stresses of the mesh constituting a deformed component analysis model, the stress is compared with a rupture stress of the component which is set in advance, and alert display of rupture of a component is performed when the stress is determined to exceed the rupture stress, and
wherein said controlling the virtual operation includes:
detecting a movement of a hand of an operator, and outputting a detection signal;
disposing a virtual glove in the virtual space, and moving the virtual glove in accordance with the detection signal so as to perform an assembling operation; and
calculating a reaction force from a deformation stress of the component analysis models calculated in the deformed structure analysis, and transmitting the force to the hand of the operator.

12. A non-transitory computer-readable storage medium which stores an assembling manipulability evaluation program characterized by causing a computer to execute:
executing an analysis model control in which at least two component models, which are to be used in assembly of a product to be evaluated, are disposed in virtual space displayed on a screen;
executing a virtual operation control in which the component models disposed in the virtual space are moved and operated in accordance with an input operation signal from outside;
executing a model conversion in which contact between the two component models are determined when a relative distance between the models become zero and the two component models are converted into component analysis models composed of a plurality of mesh-divided elements;
executing a deformed structure analysis in which contact surfaces caused along with assembly of the two component analysis models are determined, a structure analysis calculation is executed so that, with respect to movement of a contact surface of one of the component analysis models, the contact surface of another structure analysis model does not penetrate into each other, and deformation, distortion, and a stress of each element and deformation of an entire model is obtained; and
executing an evaluation process in which a maximum deformation stress is searched from among deformation stresses of the mesh constituting a deformed component analysis model, the stress is compared with a rupture stress of a component which is set in advance, and alert display of rupture of the component is performed when the stress is determined to exceed the rupture stress, and
wherein said executing the virtual operation control includes:
detecting a movement of a hand of an operator and outputting a detection;
disposing a virtual glove in the virtual space and moving the virtual glove in accordance with the detection signal so as to perform an assembling operation; and
calculating a reaction force from a deformation stress of the component analysis model calculated in the deformed structure analysis and transmitting the force to the hand of the operator.

13. A non-transitory computer-readable storage medium which stores a disassembling manipulability evaluation program characterized by causing a computer to execute an operation, comprising:
executing an analysis model control in which a product model including at least two component models to be evaluated is disposed in virtual space displayed on a screen;
executing a virtual operation control in which the component models are moved and operated to disassemble from the product model disposed in the virtual space in accordance with an input operation signal from outside;
executing a model conversion in which the two component models constituting the product model are converted into component analysis models composed of a plurality of mesh-divided elements;

executing a deformed structure analysis in which contact surfaces caused along with disassembly component analysis models are determined, a structure analysis calculation is executed so that, with respect to movement of a contact surface of one of the component analysis models, the contact surface of another structure analysis model does not penetrate into each other, and deformation, distortion, and a stress of each element and deformation of an entire model is obtained; and executing a disassembling manipulability evaluation process in which a maximum deformation stress is searched from among deformation stresses of the mesh constituting a deformed component analysis model, the stress is compared with a rupture stress of a component which is set in advance, and alert display of rupture of the component is performed when the stress is determined to exceed the rupture stress, and wherein said executing the virtual operation control includes:

detecting a movement of a hand of an operator, and outputting a detection signal;

disposing a virtual glove in the virtual space, and moving the virtual glove in accordance with the detection signal so as to perform an assembling operation; and calculating a reaction force from a deformation stress of the component analysis model calculated in the deformed structure analysis, and transmitting the force to the hand of the operator.

\* \* \* \* \*

UNITED STATES PATENT AND TRADEMARK OFFICE
CERTIFICATE OF CORRECTION

PATENT NO. : 8,447,572 B2
APPLICATION NO. : 11/905963
DATED : May 21, 2013
INVENTOR(S) : Shigeo Ishikawa Page 1 of 1

It is certified that error appears in the above-identified patent and that said Letters Patent is hereby corrected as shown below:

In the Claims

Column 19, Line 10, In Claim 10, after "component" delete "model".

Column 19, Line 11, In Claim 10, after "component" delete "model".

Column 19, Line 38, In Claim 11, after "model" delete "including".

Signed and Sealed this
Twenty-fourth Day of September, 2013

Teresa Stanek Rea
*Deputy Director of the United States Patent and Trademark Office*